US008669144B2

(12) United States Patent
Tang et al.

(10) Patent No.: US 8,669,144 B2
(45) Date of Patent: *Mar. 11, 2014

(54) METHODS OF FORMING MEMORY ARRAYS

(71) Applicant: Micron Technology, Inc., Boise, ID (US)

(72) Inventors: Sanh D. Tang, Boise, ID (US); Janos Fucsko, Hatfield, PA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/939,082

(22) Filed: Jul. 10, 2013

(65) Prior Publication Data

US 2013/0295726 A1 Nov. 7, 2013

Related U.S. Application Data

(60) Continuation of application No. 13/607,339, filed on Sep. 7, 2012, now Pat. No. 8,513,064, which is a division of application No. 13/418,767, filed on Mar. 13, 2012, now Pat. No. 8,288,213, which is a division of application No. 12/624,312, filed on Nov. 23, 2009, now Pat. No. 8,158,967.

(51) Int. Cl.
*H01L 21/82* (2006.01)

(52) U.S. Cl.
USPC ........................ 438/128; 257/5; 257/E21.645

(58) Field of Classification Search
USPC ............................... 438/128; 257/5, E21.645
See application file for complete search history.

(56) References Cited

U.S. PATENT DOCUMENTS 6,992,349 B2   1/2006  Lee et al.
7,030,459 B2   4/2006  Lai et al.
(Continued)

FOREIGN PATENT DOCUMENTS

WO    WO 2007022359         2/2007
WO    PCT/US2010/052918    5/2011
WO    PCT/US2010/052918    5/2012

OTHER PUBLICATIONS

"Vertical Si-Nanowire Based Memory Cell for 3-D Ultra-High Density Multilevel NAND Flash Applications" (Research Paper), Institute of Microelectronics, Singapore, 1 page, http://www.ime.a-star.edu.sg/html/highlights_200906_04.html, downloaded Oct. 20, 2009.

(Continued)

*Primary Examiner* — Phuc Dang
(74) *Attorney, Agent, or Firm* — Wells St. John P.S.

(57) ABSTRACT

Some embodiments include methods of forming memory arrays. A stack of semiconductor material plates may be patterned to subdivide the plates into pieces. Electrically conductive tiers may be formed along sidewall edges of the pieces. The pieces may then be patterned into an array of wires, with the array having vertical columns and horizontal rows. Individual wires may have first ends joining to the electrically conductive tiers, may have second ends in opposing relation to the first ends, and may have intermediate regions between the first and second ends. Gate material may be formed along the intermediate regions. Memory cell structures may be formed at the second ends of the wires. A plurality of vertically-extending electrical interconnects may be connected to the wires through the memory cell structures, with individual vertically-extending electrical interconnects being along individual columns of the array. Some embodiments include memory arrays incorporated into integrated circuitry.

12 Claims, 32 Drawing Sheets

(56) References Cited

U.S. PATENT DOCUMENTS

| | | |
|---|---|---|
| 7,210,224 B2 | 5/2007 | Trivedi |
| 7,214,547 B2 | 5/2007 | Drewes |
| 7,274,051 B2 | 9/2007 | Kim et al. |
| 7,332,735 B2 | 2/2008 | Campbell |
| 7,352,607 B2 | 4/2008 | Furukawa et al. |
| 7,511,984 B2 | 3/2009 | Liu |
| 7,670,942 B2 | 3/2010 | Kim et al. |
| 7,772,580 B2 | 8/2010 | Hofmann et al. |
| 7,875,871 B2 | 1/2011 | Kumar et al. |
| 8,148,711 B2 | 4/2012 | Fujii et al. |
| 2001/0053575 A1 | 12/2001 | Noble |
| 2002/0006699 A1 | 1/2002 | Noble et al. |
| 2005/0018476 A1 | 1/2005 | Kamijima et al. |
| 2007/0018237 A1 | 1/2007 | Kim et al. |
| 2007/0158736 A1 | 7/2007 | Arai et al. |
| 2007/0212795 A1* | 9/2007 | Milkove et al. ............ 438/3 |
| 2008/0173928 A1 | 7/2008 | Arai et al. |
| 2009/0014707 A1 | 1/2009 | Lu et al. |
| 2009/0050867 A1 | 2/2009 | Wells et al. |
| 2009/0146194 A1 | 6/2009 | Moselund et al. |
| 2010/0176368 A1 | 7/2010 | Ko et al. |
| 2010/0259960 A1 | 10/2010 | Samachisa |
| 2012/0329215 A1* | 12/2012 | Tang et al. ............ 438/128 |

OTHER PUBLICATIONS

Ernst, T. et al., "Novel Si-based nanowire devices: Will they serve ultimate MOSFETs scaling or ultimate hybrid integration?", Electron Devices Meeting, Dec. 15-17, 2008, pp. 1-4.

* cited by examiner

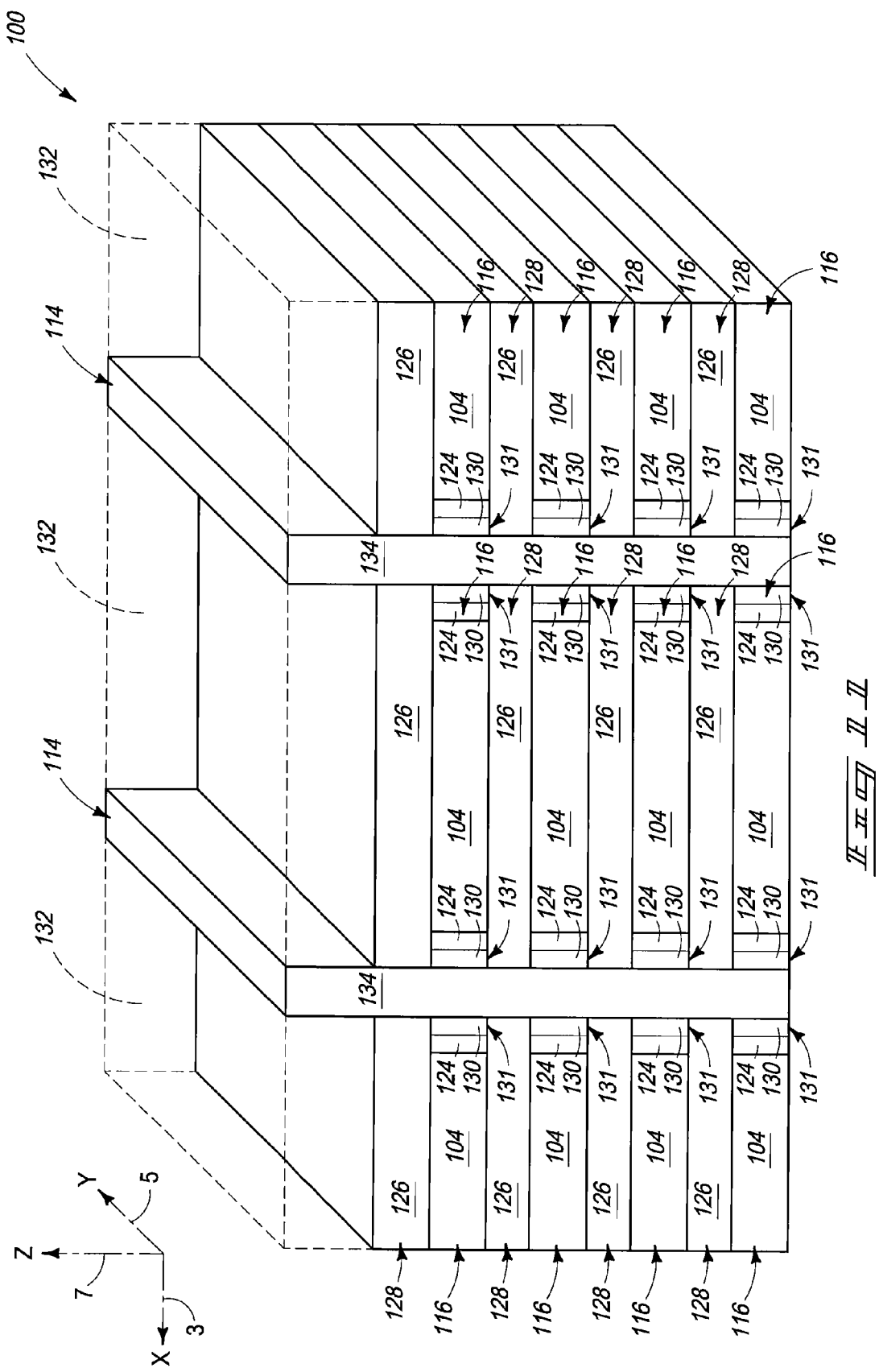

METHODS OF FORMING MEMORY ARRAYS

RELATED PATENT DATA

This patent resulted from a continuation of U.S. patent application Ser. No. 13/607,339, which was filed Sep. 7, 2012, and which issued as U.S. Pat. No. 8,513,064; which resulted from a divisional of U.S. patent application Ser. No. 13/418,767, which was filed Mar. 13, 2012, which issued as U.S. Pat. No. 8,288,213, and which is hereby incorporated herein by reference; which resulted from a divisional of U.S. patent application Ser. No. 12/624,312, which was filed Nov. 23, 2009, which issued as U.S. Pat. No. 8,158,967, and which is hereby incorporated herein by reference.

TECHNICAL FIELD

Integrated memory arrays, and methods of forming memory arrays.

BACKGROUND

An integrated circuit is a miniature electronic circuit that has been manufactured across a semiconductor material. Memory storage is one of the types of functions that may be achieved by integrated circuitry. Memory storage commonly utilizes large arrays of identical components.

A continuing goal in the fabrication of integrated memory is to increase the level of integration of memory components, and thus to increase the amount of memory that may be provided across a given amount of semiconductor real estate. This can enable large amounts of memory to be provided across small chips, which can be valuable in numerous applications, such as, for example, consumer electronics.

It is becoming increasingly difficult to reduce the scale of existing memory arrays, and thus it would be desired to develop new arrangements for memory arrays. It would be further desired for such new arrangements to be amenable to fabrication with existing technologies.

BRIEF DESCRIPTION OF THE DRAWINGS

FIGS. 6-15 are diagrammatic three-dimensional views of the portion of FIG. 5 shown at sequential processing stages of an example embodiment method of forming a memory array, with the processing stage of FIG. 6 following that of FIG. 5.

DETAILED DESCRIPTION OF THE ILLUSTRATED EMBODIMENTS

Some embodiments pertain to new vertical memory designs suitable for incorporation into integrated circuitry, and to methods of forming vertical memory. The vertical memory may enable higher levels of integration to be achieved than can be achieved with conventional planar memory, and may be suitable for fabrication with existing technologies so that it may be fabricated with relatively low cost. In some embodiments, the vertical memory utilizes field effect transistor (FET) switching devices gatedly connected with semiconductor material wires, and utilizes data storage structures formed at ends of the wires. The wires and data storage structures are together comprised by memory unit cells, and such memory unit cells may be vertically stacked to create a high density of the memory unit cells across a given region of semiconductor real estate. In some embodiments, individual memory unit cells may have feature sizes corresponding to less than or equal to 25 nanometers.

Example embodiments of integrated memory arrays, and example methods of forming integrated memory arrays, are described with reference to FIGS. 1-30.

Figure 1:
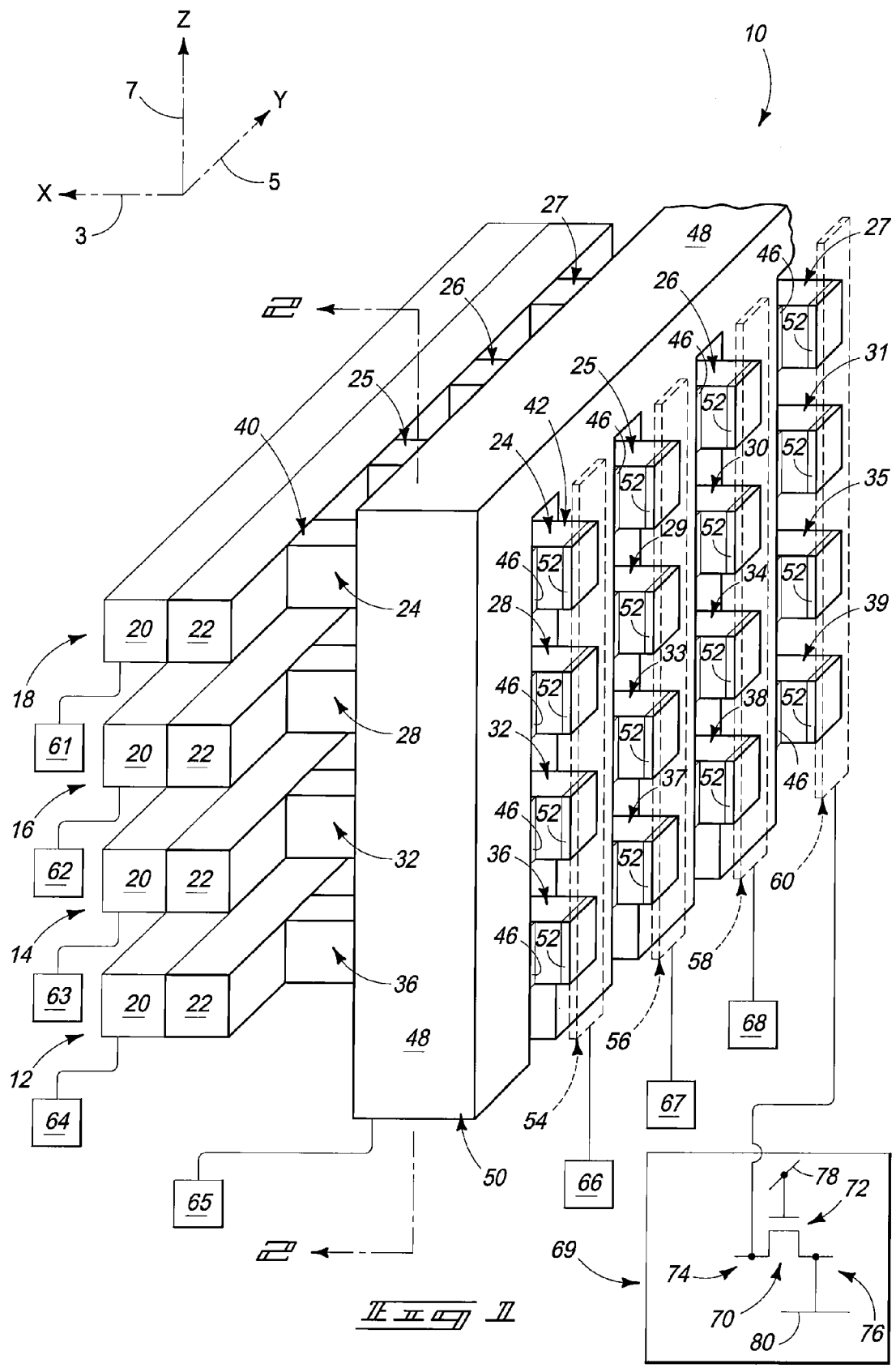
FIGS. 1 and 2 are a diagrammatic three-dimensional view, and a diagrammatic cross-sectional side view, respectively, of an example embodiment of an integrated memory array.
Figure 2:
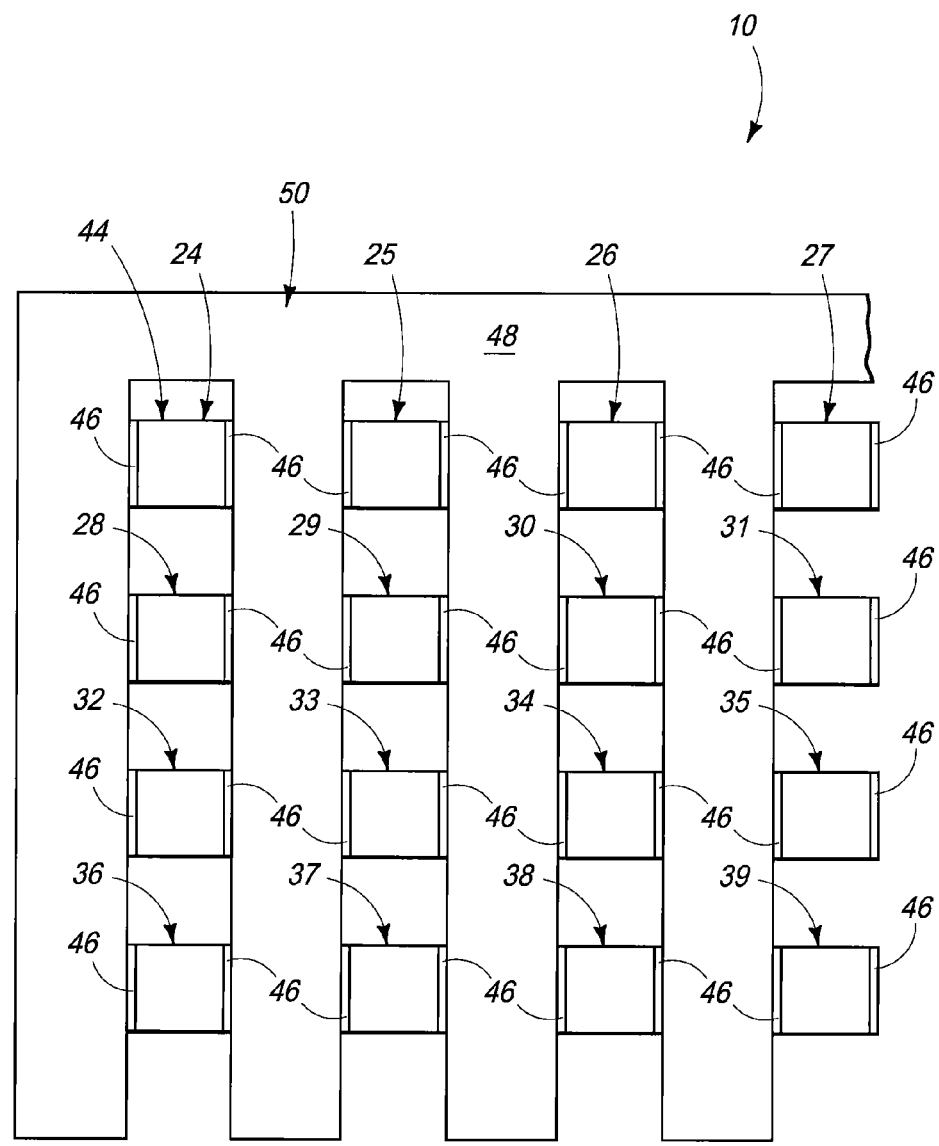

FIGS. 1 and 2 show a portion of a construction 10 comprising an example memory array. The construction is shown in three-dimensional view in FIG. 1. The three primary axes utilized for the coordinate system of FIG. 1 are shown in the upper left-hand corner of the figure. The coordinate system has a first horizontal axis 3 corresponding to an "X" axis, a second horizontal axis 5 corresponding to a "Y" axis, and a vertical axis 7 corresponding to a "Z" axis. The three primary axes 3, 5 and 7 are orthogonal to one another.

Construction 10 includes a plurality of vertically-spaced, horizontally-extending tiers 12, 14, 16 and 18. Such tiers comprise electrically conductive lines 20 and 22, with the electrically conductive lines extending along the horizontal direction of axis 5. In some embodiments, such lines may be referred to as extending "primarily" along the direction of axis 5 to indicate that there may be minor variation of the linearity of the lines along such axis.

The electrically conductive lines 20 and 22 may comprise any suitable compositions or combinations of compositions. In some embodiments, line 20 may comprise, consist essentially of or consist of one or more metals and/or one or more metal-containing compounds. For instance, line 20 may comprise, consist essentially of, or consist of metal silicide (for instance, tungsten silicide, tantalum silicide, titanium silicide, cobalt silicide, nickel silicide, etc.). In such embodiments, line 22 may comprise conductively-doped semiconductor material, such as, for example, conductively-doped silicon.

Although the electrically conductive tiers 12, 14, 16 and 18 are shown comprising two adjacent lines 20 and 22 of different conductive materials, in other embodiments the tiers may comprise only a single line of conductive material, and in yet other embodiments the tiers may comprise more than two lines of conductive materials.

Construction 10 also includes a plurality of wires 24-39 joined to the tiers 12, 14, 16 and 18, and extending horizontally along the direction of axis 3. In some embodiments, the wires may be referred to as extending "primarily" along the direction of axis 3 to indicate that there may be minor variation of the linearity of the wires along such axis.

The wires 24-39 comprise semiconductor material, such as, for example, one or both of silicon and germanium. The wires have first ends 40 (only labeled for wire 24) joined to the tiers, and have second ends 42 (only labeled for wire 24) in opposing relation to the first ends.

The wires 24-39 are arranged in a two-dimensional array, with one of the dimensions of such array being along horizontal axis 5, and the other of the dimensions of the array being along vertical axis 7. The two-dimensional array may be considered to comprise rows along horizontal axis 5, and to comprise columns along vertical axis 7.

The tiers 12, 14, 16 and 18 interconnect wires along the rows of the array (for instance, tier 18 interconnects the wires 24-27 along a row of the array).

FIG. 2 shows a cross-section along a plane orthogonal to axis 3 of FIG. 1 (specifically, along a plane parallel to axis 5 of FIG. 1), and shows that the wires 24-39 are square-shaped along such cross section. In other embodiments, the wires may have other shapes along the cross-section of FIG. 2, including, for example, circular, oval, elliptical, rectangular, etc.

Gate dielectric 46 (only some of which is labeled in FIG. 1, but all of which is labeled in FIG. 2) is along outer edges of the wires 24-39. In the shown embodiment, the wires have a square cross-sectional shape, and the gate dielectric is formed along opposing sidewalls of such square shape. Accordingly, the gate dielectric only partially surrounds the individual wires. In other embodiments, the gate dielectric may entirely surround the individual wires.

The gate dielectric 46 may comprise any suitable composition or combination of compositions, and in some embodiments may comprise, consist essentially of, or consist of silicon dioxide. The gate dielectric may be homogeneous, as shown, or may comprise multiple different materials.

Electrically conductive gate material 48 is provided around the wires 24-39. In the shown embodiment, the gate material 48 forms a gate structure 50 that extends primarily in a vertical direction (i.e., primarily along the axis 7). The gate material 48 is shown contacting the gate dielectric 46 on two opposing sides of each of wires 24-39. In other embodiments, the gate dielectric 46 may entirely surround the individual wires, and the gate material 48 may also entirely surround the individual wires.

Although the gate structure is shown comprising a single homogeneous material 48, in other embodiments the gate structure may comprise two or more different materials. The various materials of gate structure 50 may comprise any suitable composition or combination of compositions. In some embodiments, such materials may comprise one or more of various metals (for instance, titanium, tungsten, cobalt, nickel, etc.), metal-containing compositions (for instance, metal nitrides, metal silicides, etc.), and conductively-doped semiconductor materials (for instance, conductively-doped silicon, conductively-doped germanium, etc.).

The wires 24-39 may be considered to have intermediate regions 44 (FIG. 2, and labeled only for wire 24) between the first and second ends 40 and 42. The intermediate regions are not labeled in FIG. 1, due to such regions being hidden by gate structure 50.

Memory cell structures 52 (FIG. 1) are formed at the ends of wires 24-39. The memory cell structures may be alternatively referred to as data storage structures, and may be any structures suitable for storing data in a memory cell. Although the gate structures are shown to be homogeneous, in some embodiments the gate structures may comprise multiple different materials.

In some embodiments, the memory cell structures 52 may correspond to one time programmable structures, resistance RAMS (i.e., memory that changes resistance upon switching; including phase change memory, oxide RAM, etc.), multi-time programmable devices, etc. In some embodiments, the memory cell structures may be antifuse structures; such as, for example, structures of the types described in U.S. Pat. No. 7,210,224, listing Jigish D. Trivedi as the inventor, and listing Micron Technology, Inc. as the assignee. In some embodiments, the memory cell structures may correspond to MRAM structures; such as, for example, structures of the types described in U.S. Pat. No. 7,214,547, listing Joel A. Drewes as the inventor, and listing Micron Technology, Inc. as the assignee. In some embodiments, the memory cell structures may be phase change memory structures; such as, for example, structures of the types described in U.S. Pat. Nos. 7,332,735 and 7,511,984, listing Kristy A. Campbell and Jun Liu as the inventors, respectively, and listing Micron Technology, Inc. as the assignee.

If the memory cell structures 52 correspond to antifuse structures, they may contain a thin layer of dielectric material between a pair of electrodes. In operation, sufficient voltage may be passed to break down the dielectric and thereby cause the electrodes to electrically contact one another. A programming state of a memory cell structure may be designated by whether the structure is a blown antifuse, or an antifuse which is not blown. The memory cell structures 52 are shown to be homogeneous, and in some embodiments may correspond to the thin dielectric of antifuse structures. In other embodiments, the memory cell structures may not be homogeneous, but may instead comprise a pair of electrically conductive electrodes having a thin layer of dielectric material therebetween.

If memory cell structures 52 correspond to MRAM structures, then the memory cell structures may comprise a pair of magnetic materials, and a nonmagnetic material between the magnetic materials. In operation, the orientation of a magnetic moment in one of the magnetic materials may be compared relative to the orientation of a magnetic moment in the other of the magnetic materials to determine a programming state of the memory cell structure.

If memory cell structures 52 correspond to phase change memory structures, then the memory cell structures may comprise phase change material, such as, for example, various chalcogenides.

A plurality of cell strings are configured as vertically-extending electrical interconnects (specifically, vertically-extending bars) 54, 56, 58 and 60 (FIG. 1) that extend along columns of the wires (for instance, bar 54 extends along a column comprising wires 24, 28, 32 and 36), and that electrically connect to the wires through the memory cell structures 52. The bars 54, 56, 58 and 60 may comprise any suitable electrically conductive material or combination of materials, and may, for example, comprise one or more of various metals (for instance, titanium, tungsten, cobalt, nickel, etc.), metal-containing compositions (for instance, metal nitrides, metal silicides, etc.), and conductively-doped semiconductor materials (for instance, conductively-doped silicon, conductively-doped germanium, etc.). The bars 54, 56, 58 and 60 are shown in phantom view in FIG. 1 so that other structures are visible through the bars.

The tiers 12, 14, 16 and 18 are shown electrically connected to circuitry 61-64, respectively; the gate structure 50 is shown electrically connected to circuitry 65; and the vertical bars 54, 56, 58 and 60 are shown electrically connected to circuitry 66-69, respectively. Most of the circuitry is illustrated with boxes, and it is to be understood that the circuitry can be any suitable circuitry. The circuitry may be provided in any suitable locations proximate the various structures of construction 10. For instance, at least some of the circuitry may be under the construction, at least some of the circuitry may be laterally adjacent the construction, and/or at least some of the circuitry may be over the construction. The circuitry corresponds to logic and wiring utilized to read and/or write from the memory array of construction 10.

An example circuit is shown for circuitry 69. Such example circuit includes a transistor 70 having a gate 72 and source/drain regions 74 and 76. The gate is electrically connected to a row line 78, one of the source/drain regions is electrically connected to bar 60, and the other of the source/drain regions is connected to a bitline 80.

The wires 24-39 may be doped so that such wires, in combination with gate structure 50, form a plurality of transistor devices. Specifically, the intermediate regions 44 of the wires may be doped to correspond to channel regions of the transistor devices, and the ends 40 and 42 of the wires may be doped to correspond to source/drain regions of the transistor devices. In operation, current passed through gate structure 50 may be used to gatedly couple the source/drain regions at the ends of the wires to one another through the channel regions in the intermediate portions the wires. The various circuitry 61-69 may be utilized to uniquely address individual memory cell structures 52 when current is passed through gate structure 50. For instance, circuitry 61 electrically connects to a memory cell structure 52 at the end of wire 24, and circuitry 66 electrically connects to the same memory cell structure through vertical bar 54. Thus, the circuitries 61 and 66 may be together utilized to program such memory cell structure and/or to read the programmed state of such memory cell structure. If the memory cell structure is an antifuse device, the programming may comprise providing a sufficient voltage differential between circuitry 61 and circuitry 66 to blow the antifuse; and subsequent reading may comprise ascertaining if current flow through the memory structure corresponds to a blown or a not-blown antifuse device.

Although construction 10 is shown having gaps between the vertically-spaced tiers 12, 14, 16 and 18, between adjacent wires, and between adjacent vertical bars 54, 56, 58 and 60; any suitable dielectric materials may be provided in such gaps to electrically isolate the various electrical components from one another.

Construction 10 may be formed to be integrated circuitry supported by a semiconductor substrate, and may be formed utilizing any suitable fabrication process. Example processes are described with reference to FIGS. 3-30.

Figure 3:
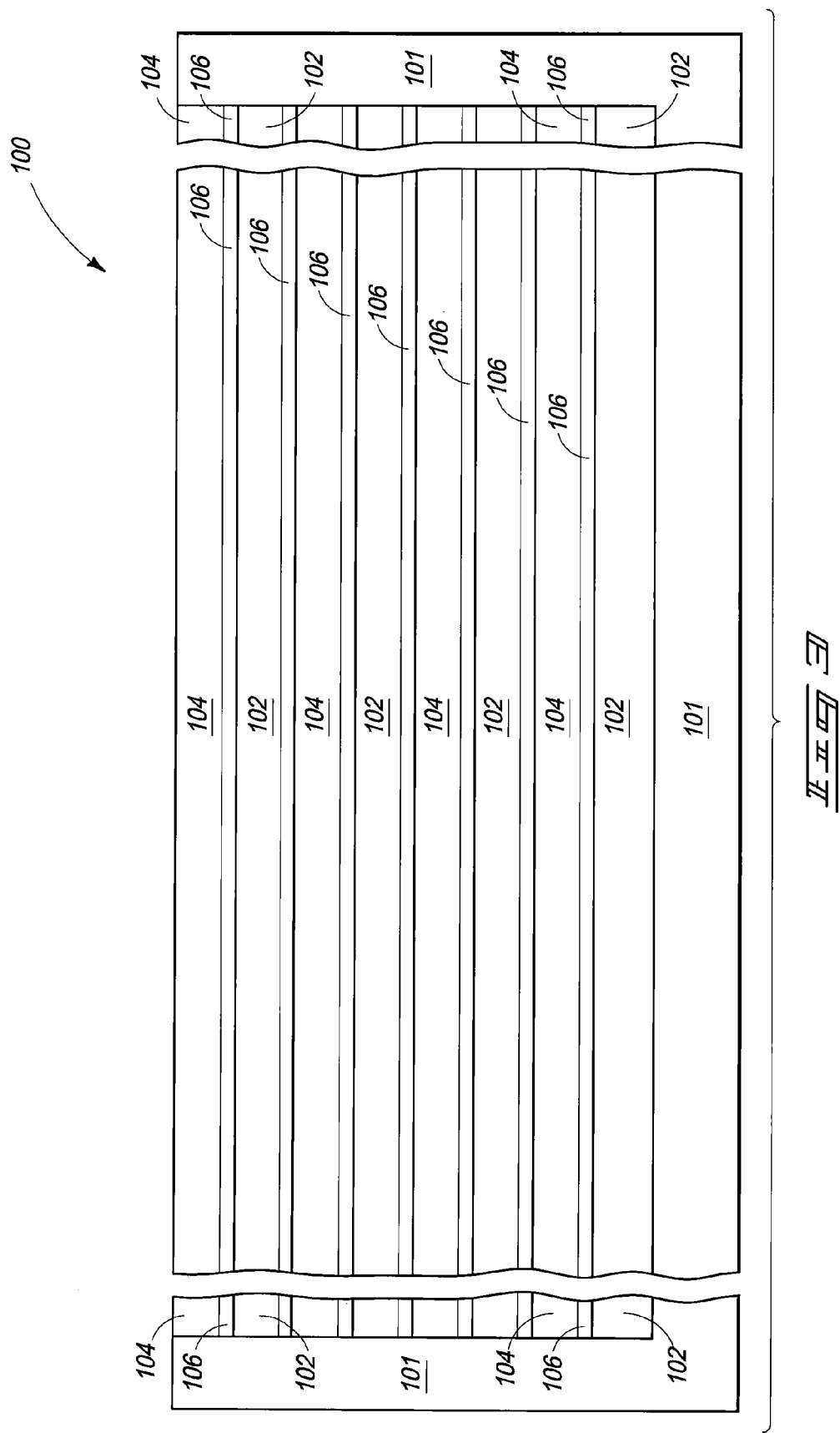
FIG. 3 is a diagrammatic cross-sectional side view of a construction shown at a processing stage of an example embodiment method of forming a memory array.

Referring to FIG. 3, a semiconductor construction 100 comprises alternating layers of first and second materials 102 and 104, respectively. The materials are supported by a substrate 101.

Substrate 101 can comprise, consist essentially of, or consist of, for example, monocrystalline silicon lightly-doped with background p-type dopant, and may be referred to as a semiconductor substrate. The term "semiconductor substrate" means any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, semiconductor substrates.

The second material 104 is ultimately patterned into wires analogous to the wires 24-39 of FIG. 1. Accordingly, the second material 104 comprises semiconductor material, and in some embodiments may comprise, consist essentially of, or consist of one or both of silicon and germanium.

In some embodiments, the first material 102 is selectively removable relative to the second material 104. In such embodiments, materials 102 and 104 may both correspond to semiconductor materials, but may differ from one another in composition and/or doping. For instance, one of the materials 102 and 104 may comprise silicon and not germanium; while the other comprises germanium and not silicon. As another example, one of the materials 102 and 104 may consist of silicon, while the other comprises, consist essentially of, or consists of a combination of silicon with germanium. As yet another example, both of materials 102 and 104 may correspond to doped silicon, but one of the materials may be p-type doped and the other may be n-type doped.

In the shown embodiment, barrier material 106 is provided between the materials 102 and 104. The barrier material may be used to prevent dopant from dispersing between layers 102 and 104 in embodiments in which a difference between materials 102 and 104 is the dopant type and/or concentration. In other embodiments, the barrier material may be omitted. The material 106 may comprise any suitable composition, and in some embodiments may be an electrically insulative material. For instance, material 106 may comprise, consist essentially of or consist of silicon dioxide.

In some embodiments, the first material 102 is an electrically insulative material. For instance, the first material may comprise, consist essentially of or consist of silicon dioxide. The barrier material 106 may be omitted in such embodiments, so that materials 102 and 104 are stacked directly against one another. In embodiments in which material 102 is an electrically insulative material, the material 102 may be considered to be in the form of electrically insulative sheets provided between vertically-stacked plates of material 104.

The alternating materials 102 and 104 may be formed over substrate 101 with any suitable processing. For instance, the alternating materials may be formed by epitaxial growth from over a surface of substrate 101; and/or may be deposited over the surface of substrate 101 utilizing chemical vapor deposition (CVD) and/or atomic layer deposition (ALD). In embodiments in which barrier material 106 is provided, such barrier material may be formed utilizing any suitable processing; including for example, one or both of CVD and ALD.

In the shown embodiment, materials 102 and 104 are formed within a trench that extends into substrate 101. In other embodiments, materials 102 and 104 may be formed across a non-trenched upper surface of substrate 101, rather than within a trench.

Although substrate 101 is shown to be homogeneous, in some embodiments there may be circuitry formed across or within substrate 101 prior to forming the alternating materials 102 and 104. For instance, some of the circuitry 61-69 of FIG. 1 may be provided over or within substrate 101 prior to forming the alternating materials 102 and 104.

Figure 4:
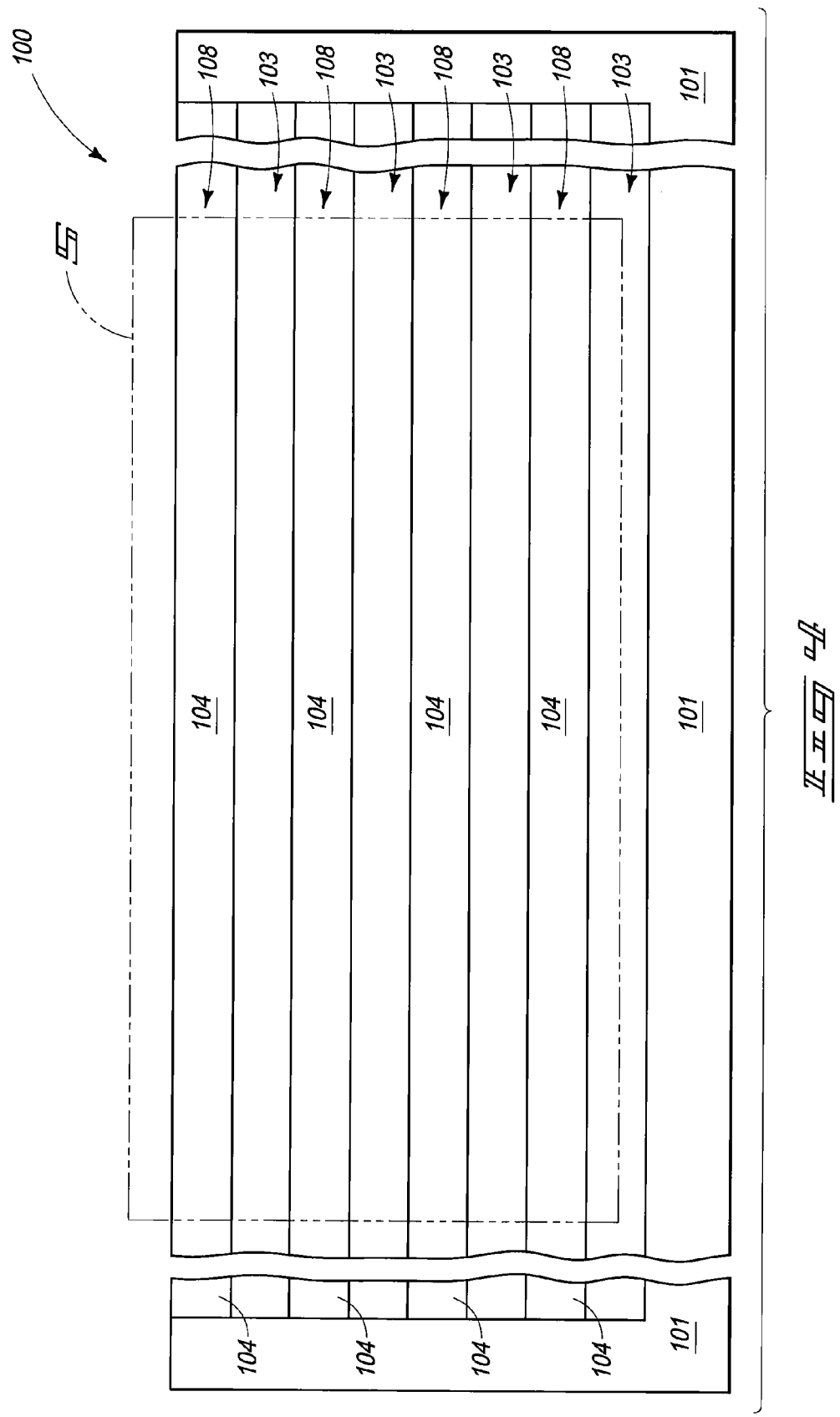
FIG. 4 is a diagrammatic cross-sectional side view of the construction of FIG. 3 shown at a processing stage subsequent to that of FIG. 3.

Referring to FIG. 4, materials 102 and 106 (FIG. 3) are selectively removed relative to material 104 to leave a stack of vertically-spaced plates 108 of material 104. The plates are spaced from one another by gaps 103.

The materials 102 and 106 may be removed by forming openings (not shown) extending through materials 102, 104 and 106, and then providing etchant within such openings; with the etchant being selective for materials 102 and 106 relative to material 104. Although material 106 is shown to have been removed, in other embodiments only material 102 may be removed; and accordingly materials 104 and 106 may remain at the processing stage of FIG. 4.

The selective removal of material 102 relative to material 104 may comprise any suitable processing. In some embodiments, material 102 comprises germanium and material 104 consists of silicon; and the removal of material 102 utilizes one or more of hydrofluoric acid, nitric acid, acetic acid, hydrogen peroxide, ammonium hydroxide, ozone and HCl. In some embodiments, material 102 comprises p-type doped silicon, and material 104 comprises n-type doped silicon, and the selective removal of material 102 utilizes tetramethylammonium hydroxide.

The shown embodiment has four vertically-spaced plates 108. The number of vertically-spaced plates may be selected to achieve a desired number of wires along a column of a memory array of the type shown in FIG. 1; and accordingly may be a number greater than four.

An advantage of forming the alternating materials within the trench is that the sidewalls of the trench may assist in supporting the vertically-spaced plates 108. In the shown embodiment, the vertically-spaced plates 108 are supported only by the sidewalls of the trench that the plates have been formed in. In other embodiments, spacers (not shown) may be provided between the plates to support the plates.

Figure 5:
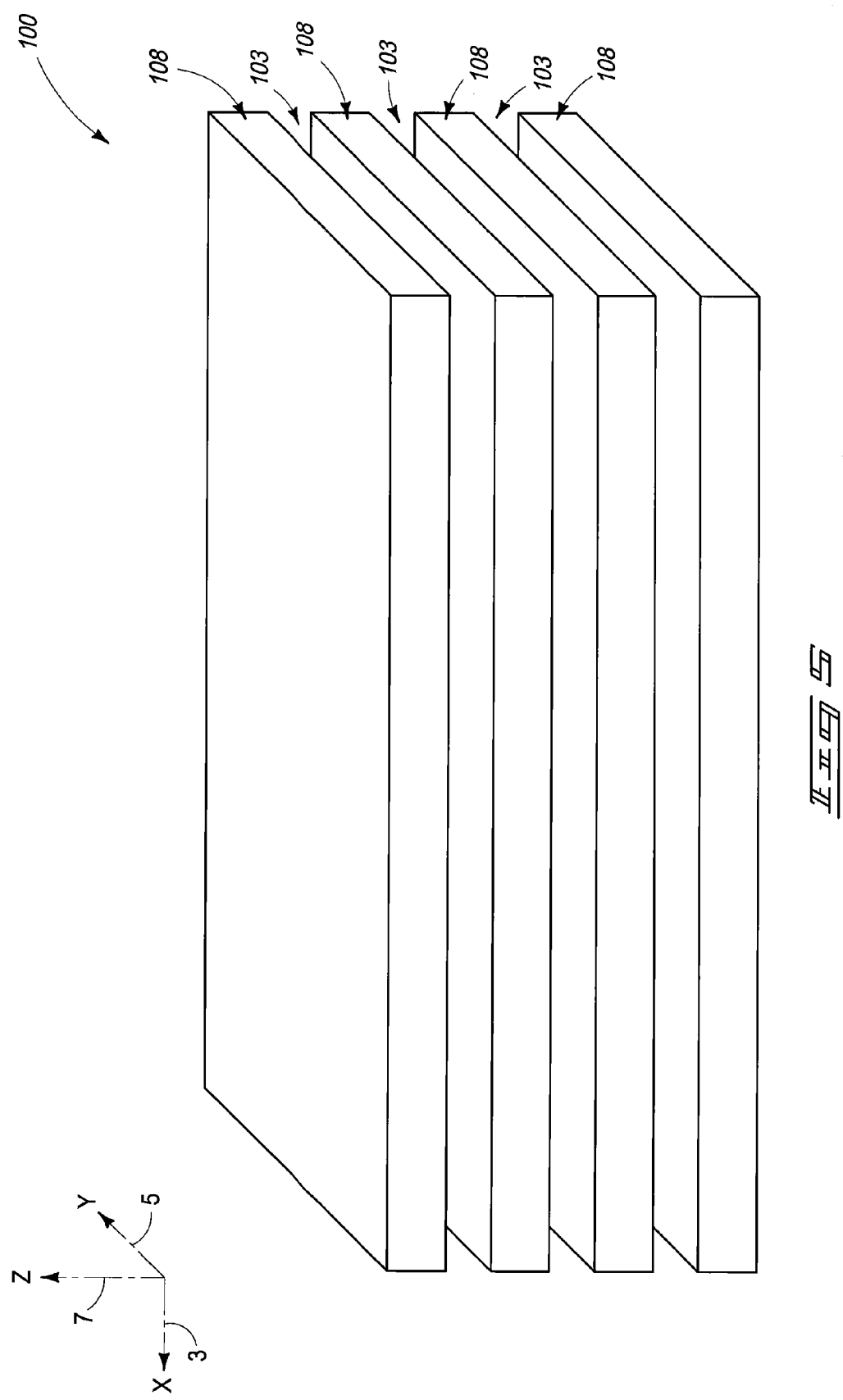
FIG. 5 is a diagrammatic three-dimensional view of a portion of the construction of FIG. 4 (specifically, the portion labeled "5" in FIG. 4), shown at the processing stage of FIG. 4.

FIG. 5 shows a three-dimensional view of a portion of FIG. 4 corresponding to the vertically-spaced plates 108 in isolation from substrate 101. The three-dimensional view of FIG. 5 utilizes the same coordinate system discussed above with reference to FIG. 1, and accordingly coordinate axes 3, 5 and 7 are shown in the upper left-hand corner of FIG. 5. The remaining FIGS. 6-30 will be shown in isolation from substrate 101 in order to simplify the drawings, but it is to be understood that the various structures shown in FIGS. 6-30 would be supported by the semiconductor substrate 101.

In embodiments in which material 102 (FIG. 3) comprises an electrically insulative material, the processing of FIG. 4 may be omitted, so that the insulative material remains between the vertical plates at subsequent processing steps. Accordingly, in some embodiments, the structure of FIG. 5 will comprises sheets of insulative material 102 within the regions shown as gaps 103 in the figure.

Figure 6:
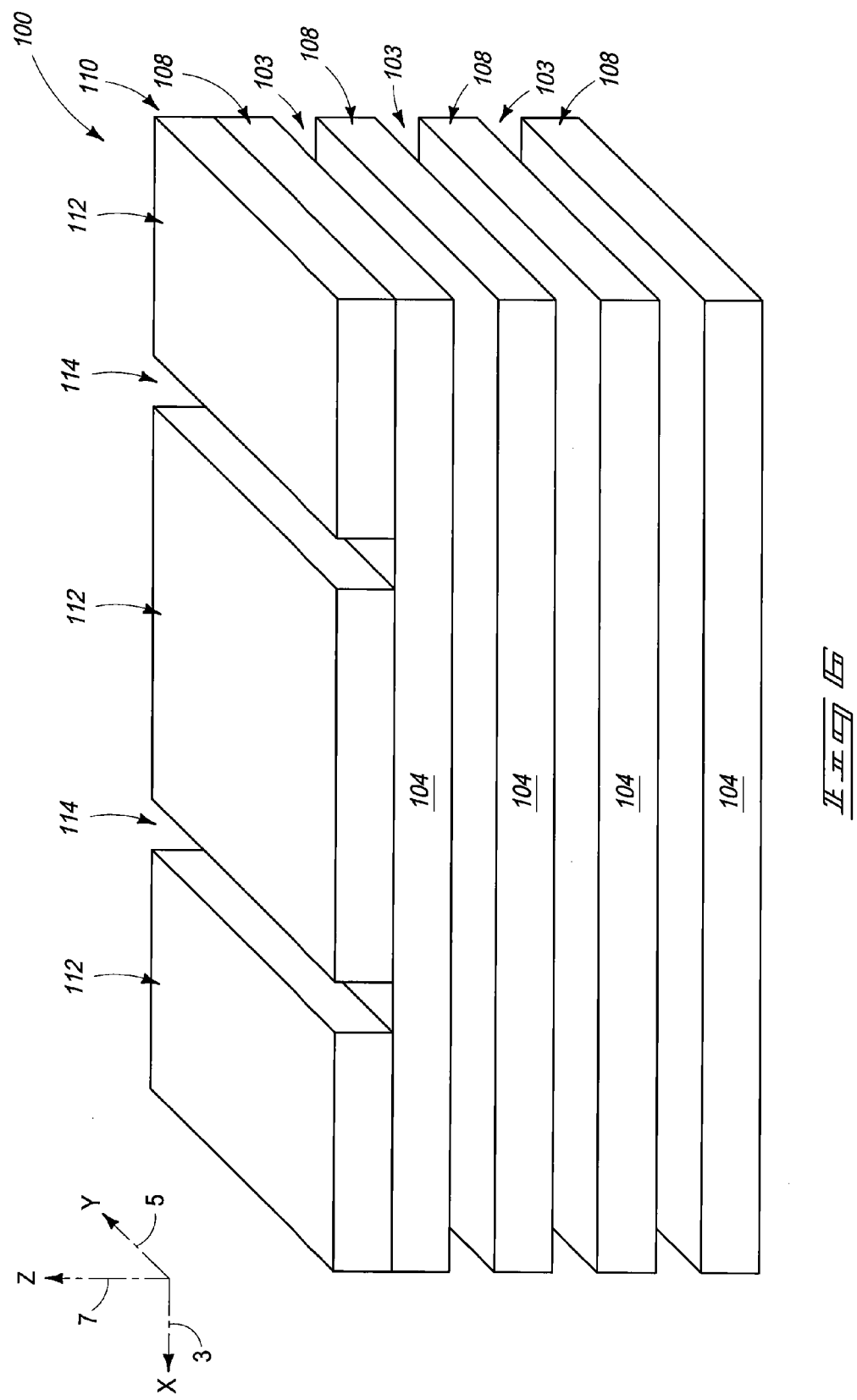

Referring to FIG. 6, a patterned mask 110 is formed over the vertically-stacked plates 108. Mask 110 comprises a plurality of features 112 which are spaced from one another by gaps 114. The features 112 may be formed from any suitable material; including, for example, a hard mask material (for instance, metal nitride, silicon nitride, etc.). If the features 112 comprise a hard mask material, such material may be formed into the shown pattern by initially forming a uniform layer of the material across the upper surface of the top plate 108; then forming photolithographically-patterned photoresist over the hard mask material, transferring a pattern from the photoresist into the hard mask material, and subsequently removing the photoresist to leave the shown construction. In other embodiments, the photoresist may remain over the hard mask material at the processing stage of FIG. 6.

Figure 7:
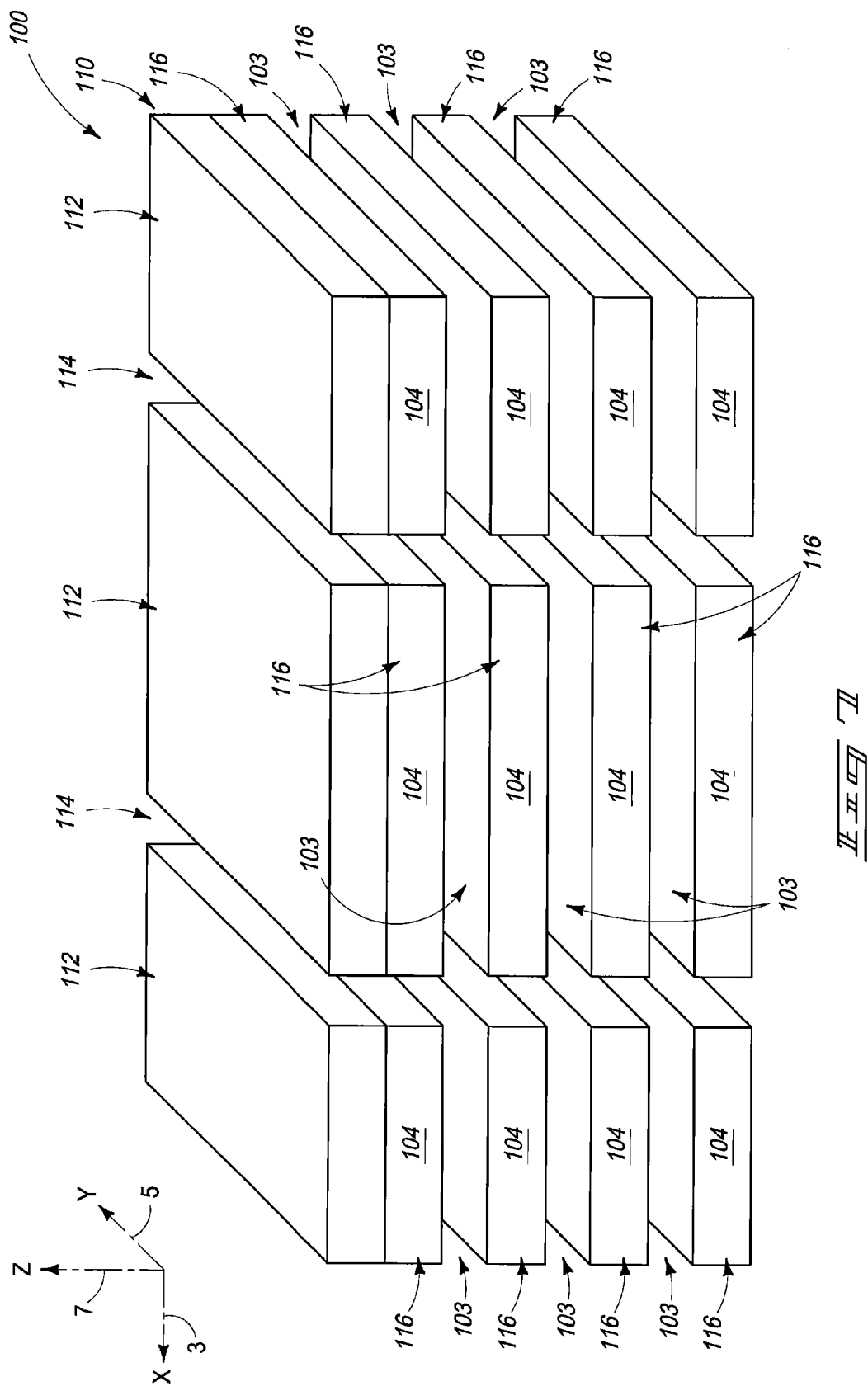

Referring to FIG. 7, gaps 114 are extended through plates 108 (FIG. 6) with a suitable etch; such as, for example, a reactive ion etch. Such subdivides the plates into a plurality of planar pieces 116. Spacers, lattices, or other supporting structures (not shown) may be provided between and under the plates at various locations, prior to the subdivision of the plates, to support the various planar pieces.

In embodiments in which the material 102 of FIG. 3 is not removed (i.e., in the embodiments discussed above with reference to FIGS. 3-5 in which insulative material sheets of material 102 remain in the locations shown as gaps 103), the etching of FIG. 7 will be conducted through a stack comprising alternating materials 102 and 104. Such etching may be considered to subdivide the plates 108 (FIG. 6) into planar pieces 116, and to subdivide the insulative material 102 (FIG. 3) into insulative spacers between the planar sheets (the insulative spacers would be in the locations of gaps 103 in FIG. 7).

Figure 8:
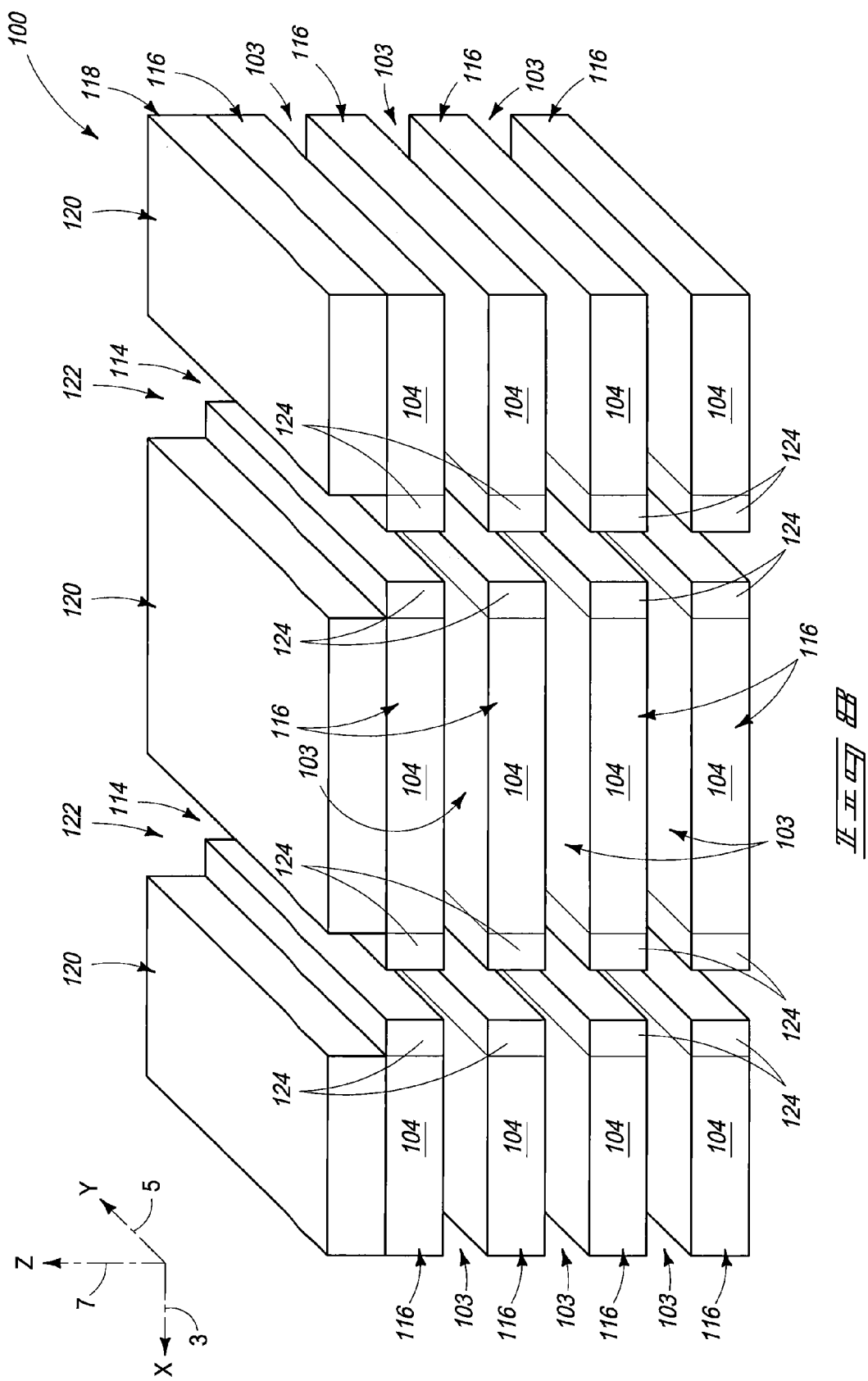

Referring to FIG. 8, mask 110 (FIG. 7) is removed, and replaced with a new mask 118. Mask 118 comprises a plurality of features 120 which are spaced from one another by gaps 122. Gaps 122 are wider than the gaps 114 (FIG. 6) that had been defined by the previous mask 110 (FIG. 6). Mask 118 may be formed of any suitable material or combination of materials; including, for example, one or both of a hard mask material and photoresist.

After mask 118 is provided, dopant is implanted through gaps 122 to form implant regions 124 along sidewalls of the semiconductor material 104 of the planar pieces 116. In some embodiments, the dopant may be n-type. In such embodiments the implant regions 124 may comprise an "n" dopant level or an "n+" dopant level, and in either event will be conductively-doped regions.

Figure 9:
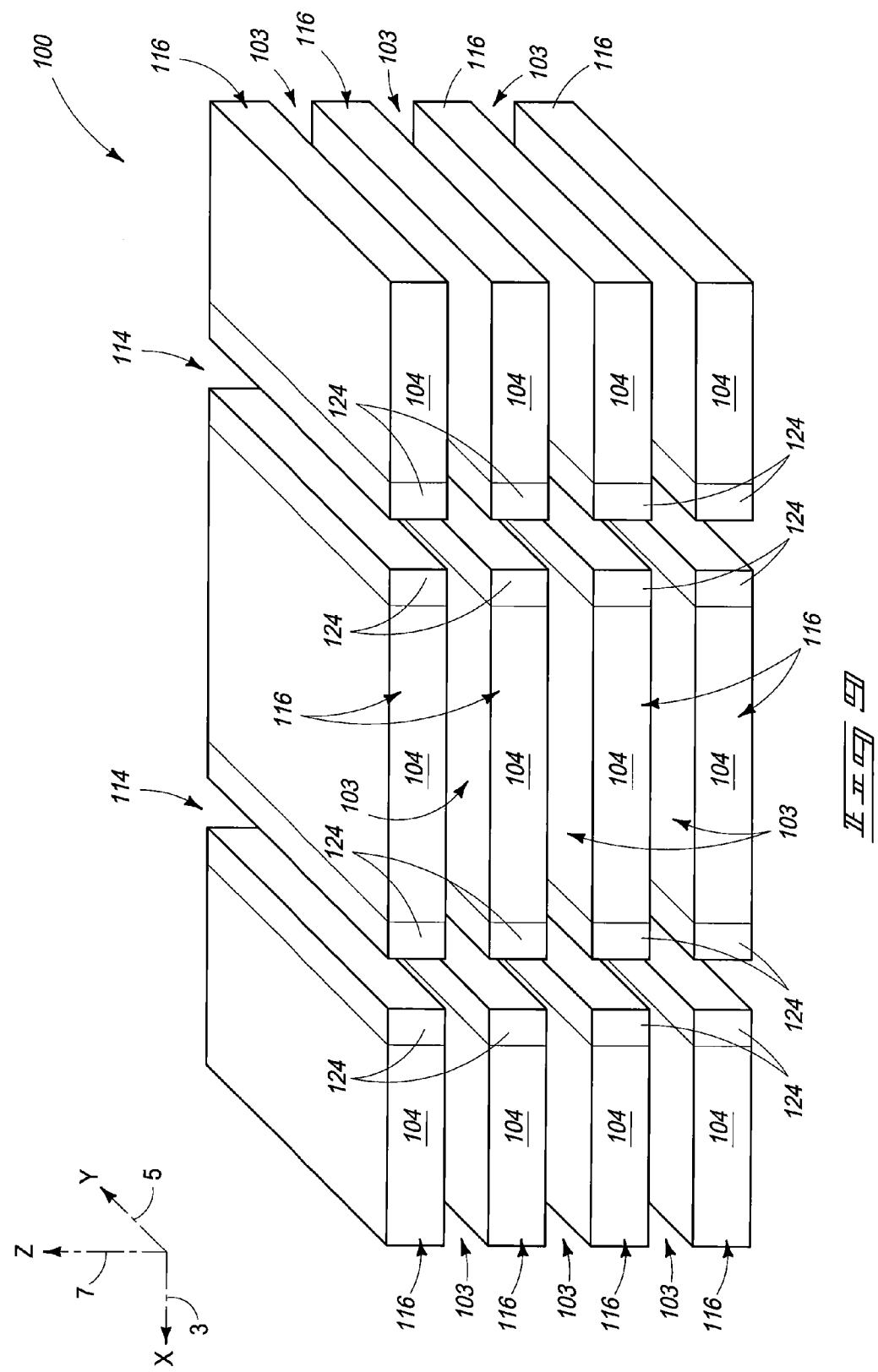

After the implant regions 124 are formed, the mask 118 may be removed to leave the construction shown in FIG. 9.

Figure 10:
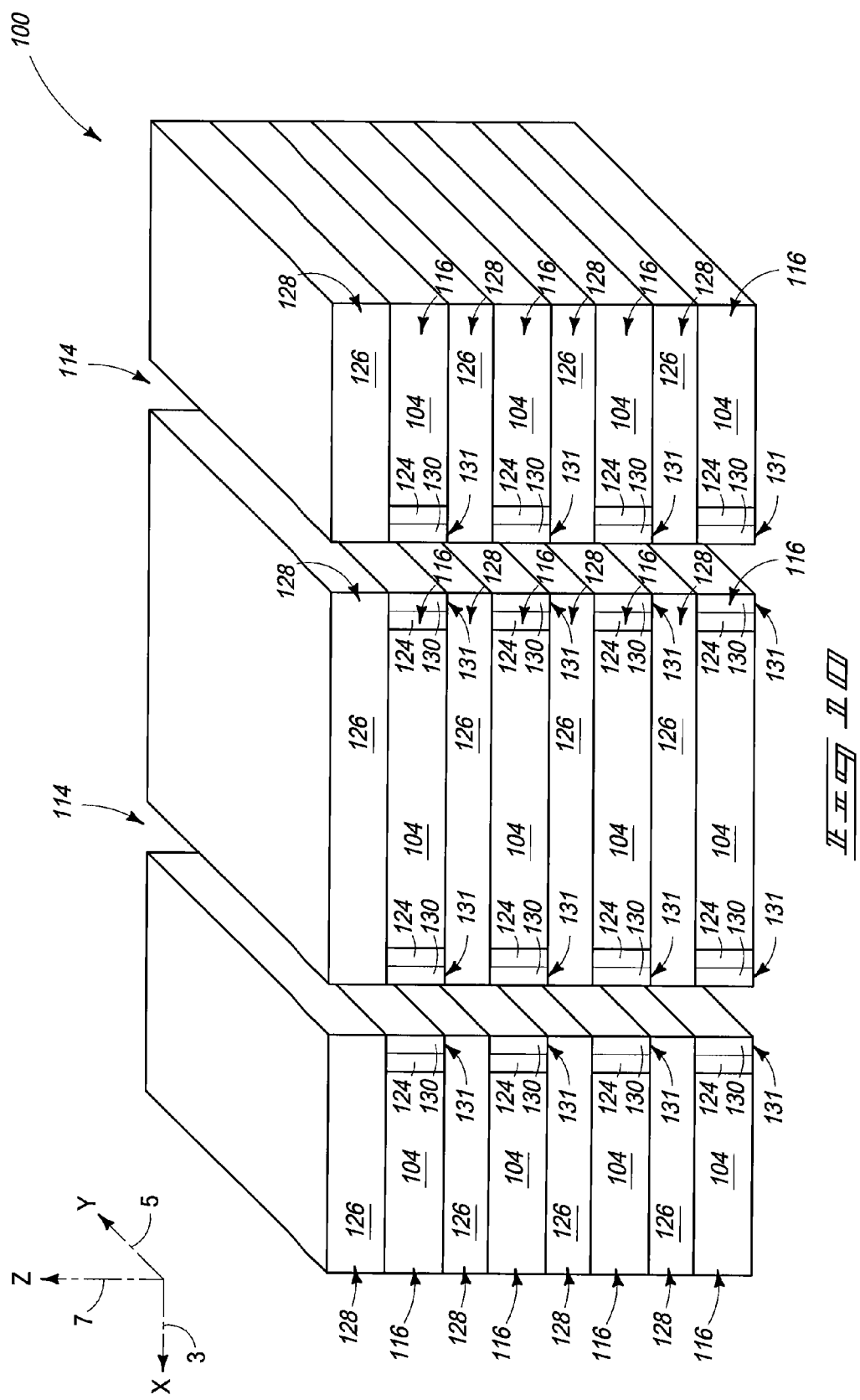
Figure 12:
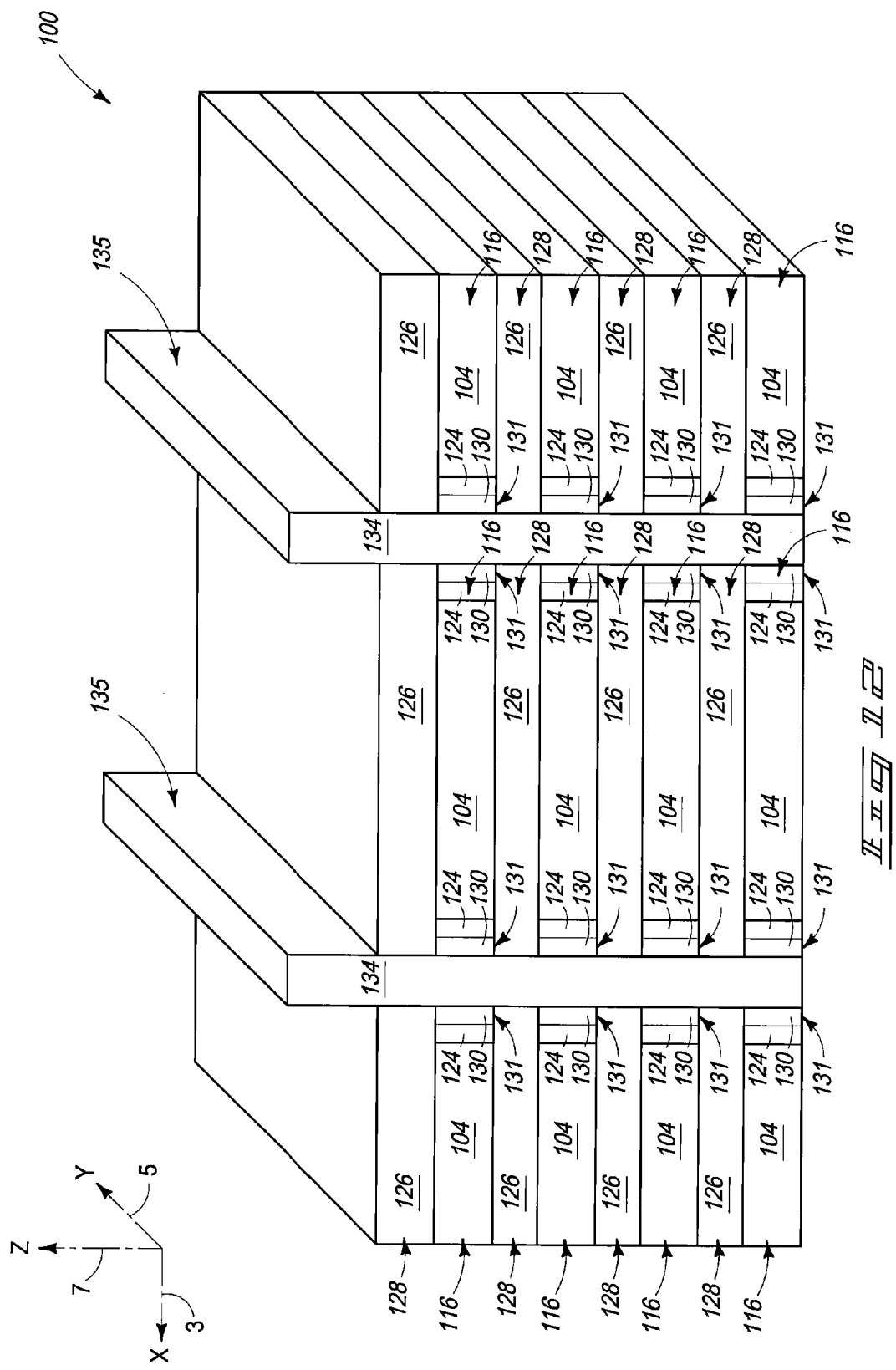

Referring to FIG. 10, insulative material 126 is formed between the planar pieces 106. The insulative material 126 may comprise any suitable composition, and in some embodiments may comprise, consist essentially of, or consist of silicon dioxide. Insulative material 126 may be formed with any suitable processing, including, for example, one or both of CVD and ALD. In embodiments in which material 102 (FIG. 3) is insulative material (such as silicon dioxide), and in which the processing of FIG. 4 is omitted so that material 102 remains between the planar pieces 116 at the processing stage of FIG. 8 (instead of the gaps 103), the insulative material between the planar pieces may be material 102 instead of material 126.

The insulative material 126 forms spacers 128 between the planar pieces 116, and also forms a spacer 128 over the uppermost planar piece 116. There may also be insulative material along the bottom of the lowermost planar piece 116, although such is not shown in FIG. 10. The shown construction comprises stacks of alternating materials 104 and 126; or alternatively considered, comprises stacks of alternating planar pieces 116 and spacers 128.

The gaps 114 remain between the planar pieces 116 after formation of insulative material 126. If the formation of the insulative material fills or partially fills such gaps, additional masking and etching may be conducted to re-establish the gaps and form the construction of FIG. 10.

After insulative material 126 is formed, construction 100 is subjected to salicidation conditions to form silicide 130 along outer edges of the doped regions 124. The silicide 130 forms electrically conductive tiers 131 along the sidewall edges of semiconductor material 104, with such tiers being analogous to those described in FIG. 1 as tiers 12, 14, 16, and 18. The tiers 131 are linear, and extend primarily along the horizontal axis 5 of the three-dimensional coordinate system shown in the figures.

The silicide 130 may comprise any suitable composition, and may, for example, comprise, consist essentially of, or consist of one or more of cobalt silicide, nickel silicide, titanium silicide, etc.

The salicidation reaction is one of many methods that may be used to form conductive runners along the sidewall edges of the planar pieces 116. Another example method is to laterally recess such sidewall edges to form gaps over the underlying spacers 128, and to then fill such gaps with one or more electrically conductive materials (for instance, one or more of various metals, metal-containing compositions, and conductively-doped semiconductor materials).

Figure 11:
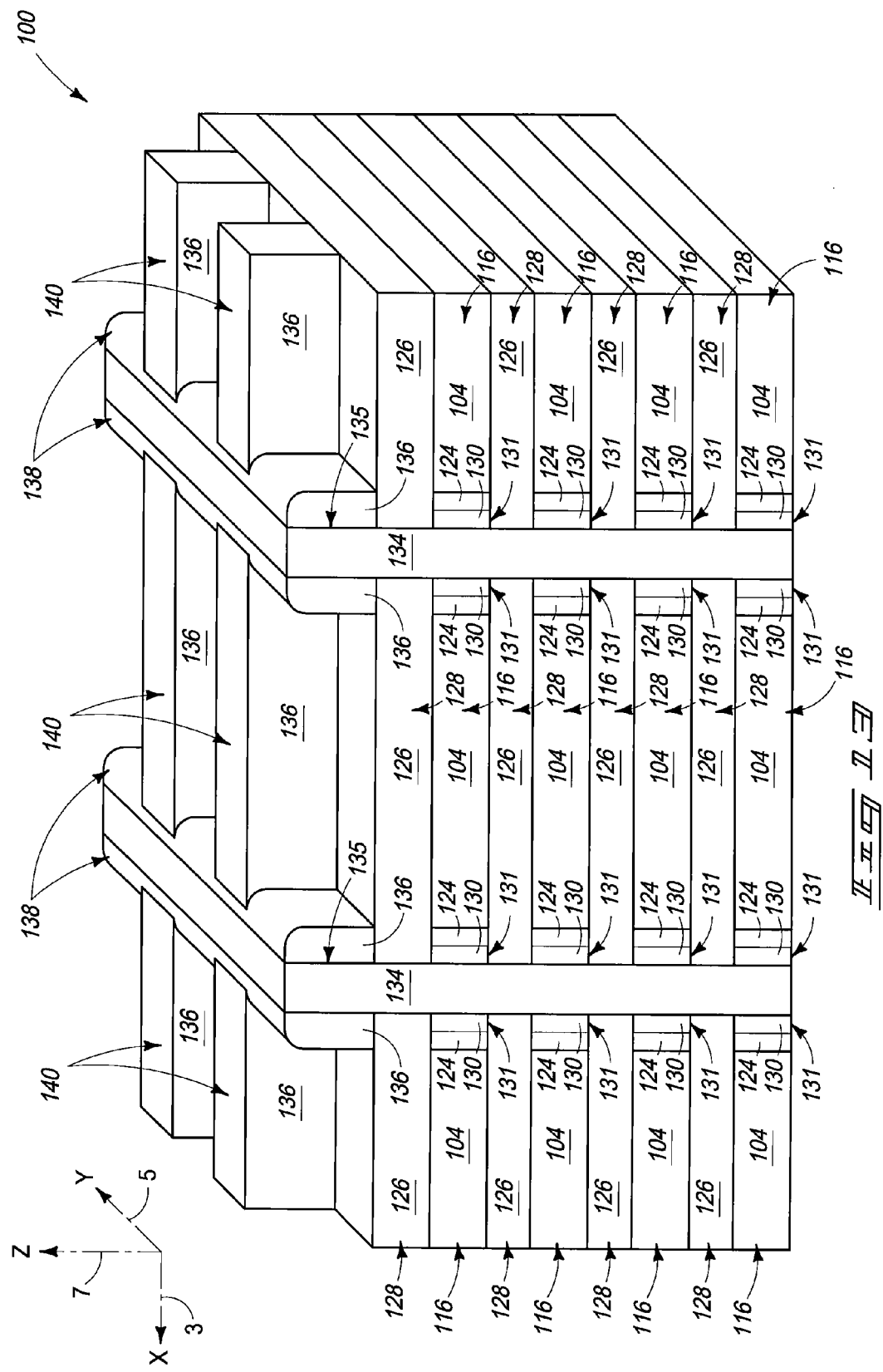

Referring to FIG. 11, a patterned mask 132 (shown in dashed line) is formed over the stack of materials 104/126, and is used to pattern a fill within gaps 114 so that the gaps become filled with insulative material 134. Insulative material 134 may have any suitable composition, and in some embodiments may comprise, consist essentially of, or consist of silicon dioxide. The insulative material may be deposited within the gaps 114 and over the mask 132, and then chemical-mechanical polishing (CMP), or other suitable processing, may be used to remove the insulative material from over the mask. In subsequent processing, the mask may be removed to leave the construction of FIG. 12. Such construction has rails 135 of material 134 extending above the uppermost surfaces of the stacks of materials 104/126.

Referring to FIG. 13, masking material 136 is formed over the stacked materials 104/126 and patterned into a mask. The patterned mask has segments 138 extending along rails 135, and has segments 140 extending orthogonally to the segments 138. The segments 138 and 140 may be formed sequentially relative to one another in some embodiments.

The masking material 136 may be a hard mask material (for instance, metal nitride, silicon nitride, etc.). The material 136 may be formed in the shown pattern by initially forming a uniform layer of hard mask material across the stacked materials 104/126; then forming photolithographically-patterned photoresist over the hard mask material, transferring a pattern from the photoresist into the hard mask material, and subsequently removing the photoresist to leave the shown construction. In other embodiments, the photoresist may remain over the hard mask at the processing stage of FIG. 13.

Figure 14:
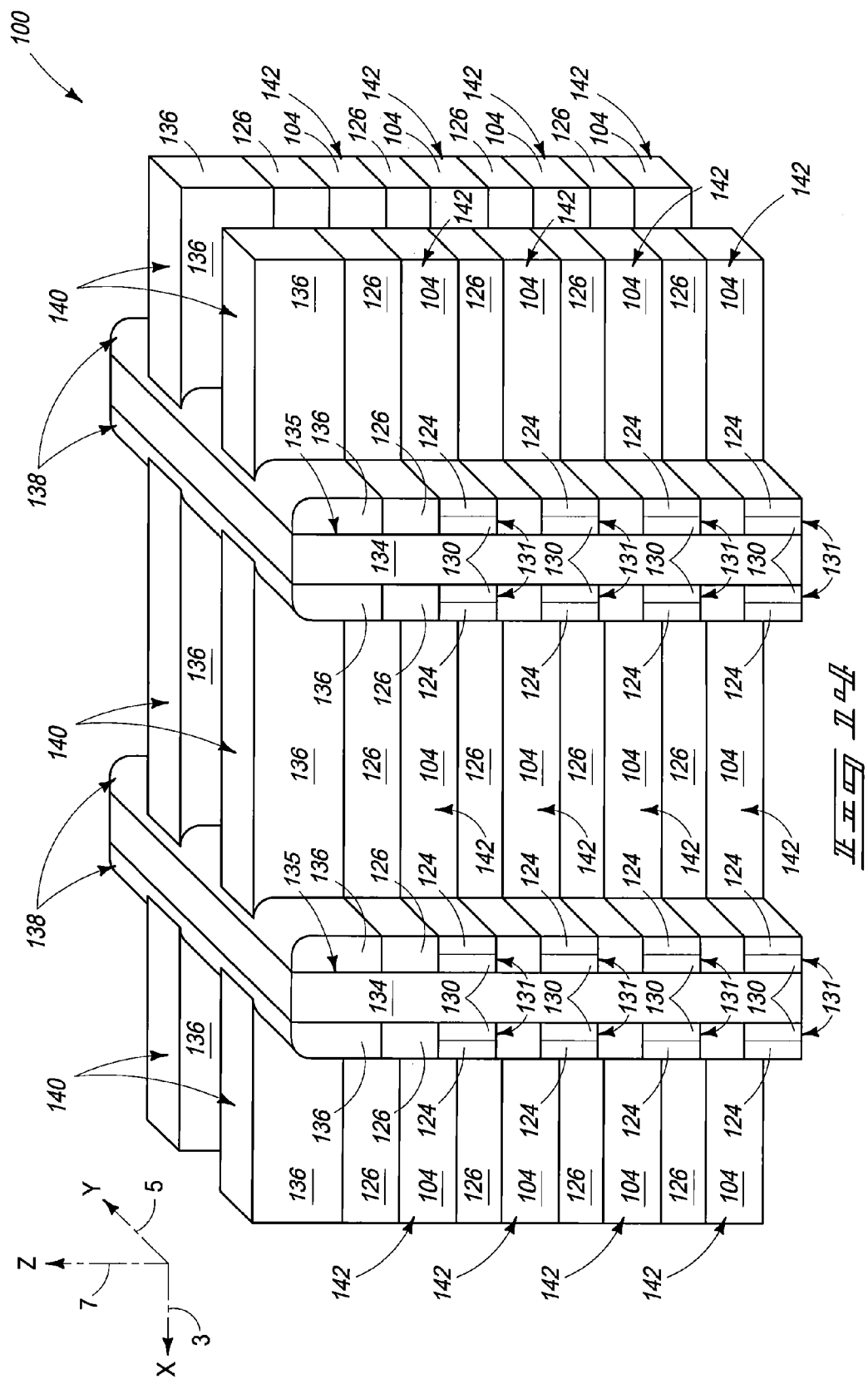

Referring to FIG. 14, patterned material 136 is used as a mask during an etch into stacked materials 104/126. Such etch may be any suitable etch; such as, for example, a reactive ion etch.

The etching through material 104 of the planar pieces 116 (FIG. 13) forms lines 142 of the semiconductor material 104, with such lines extending orthogonally to tiers 131; and specifically extending along the axis 3 of the three-dimensional coordinate system shown in the figures. The lines 142 will ultimately be patterned to form wires analogous to those described in FIG. 1 as wires 24-39.

Figure 15:
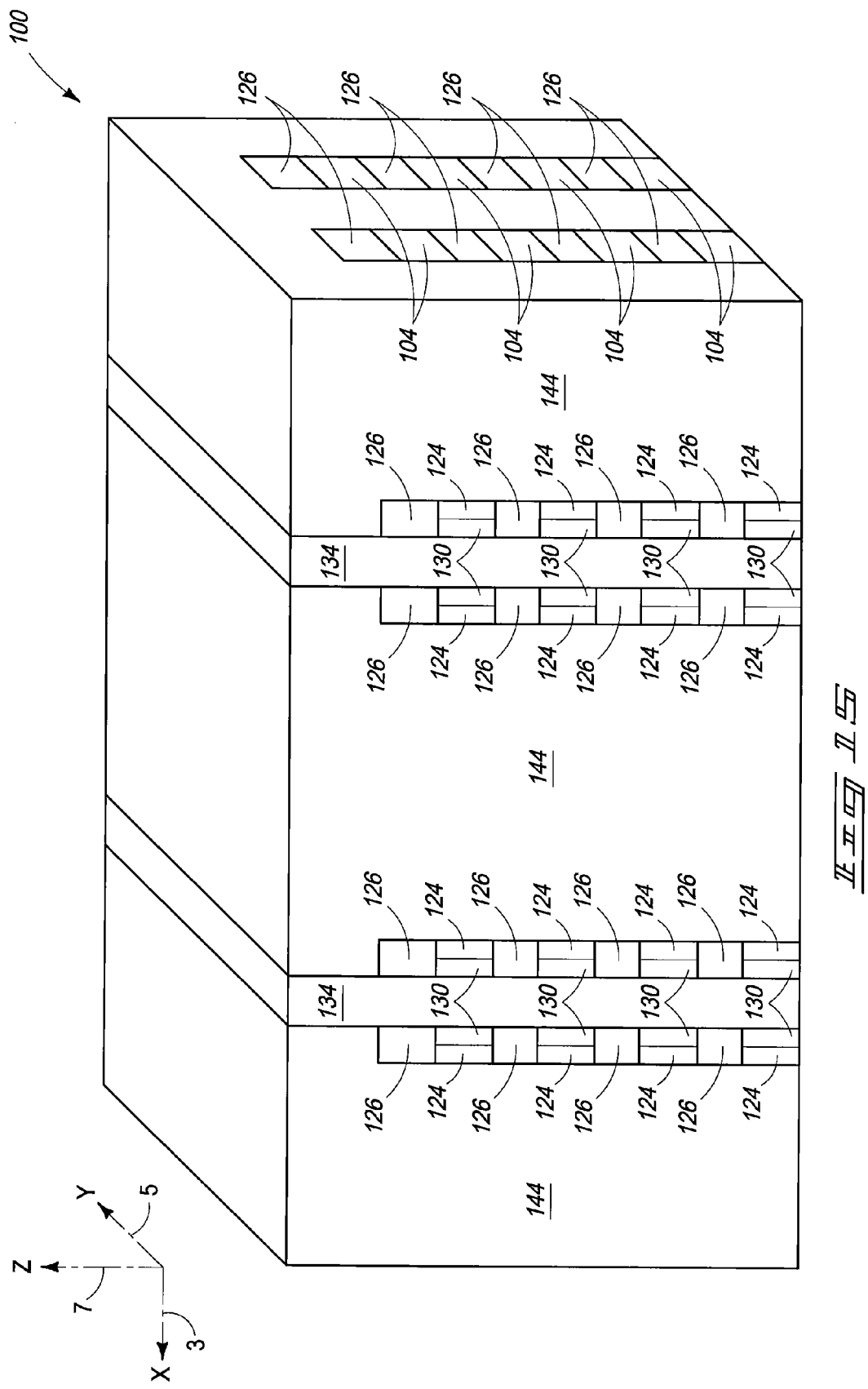

Referring to FIG. 15, masking material 136 (FIG. 14) is removed, and the remaining structure is covered with an insulative material 144. Such insulative material may, for example, comprise, consist essentially of, or consist of silicon dioxide. In some embodiments, at least some of the masking material 136 may not be removed prior to forming insulative material 144. For instance the segments 138 (FIG. 14) of the masking material that are along rails 134 (FIG. 14) may remain at the processing stage of FIG. 15 in some embodiments.

Figure 16:
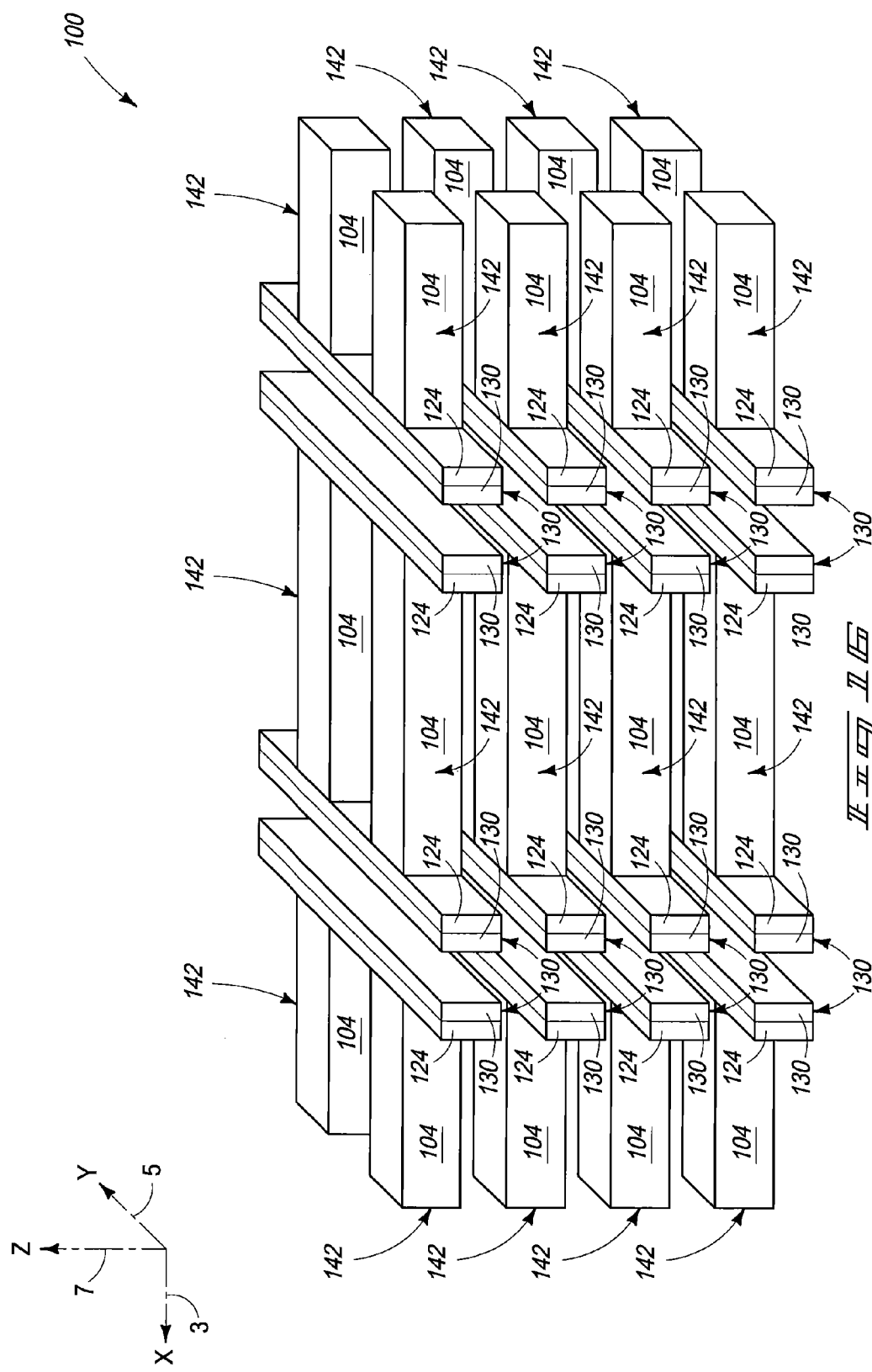
FIG. 16 is a diagrammatic three-dimensional view of several of the structures of FIG. 15 that are hidden from view in the illustration of FIG. 15.

FIG. 16 shows the arrangement of the various conductive and semiconductive components at the processing stage of FIG. 15, in isolation from the insulative components of FIG. 15, to assist the reader in visualizing the layout of various structures that are hidden from view in the diagram of FIG. 15.

Figure 17:
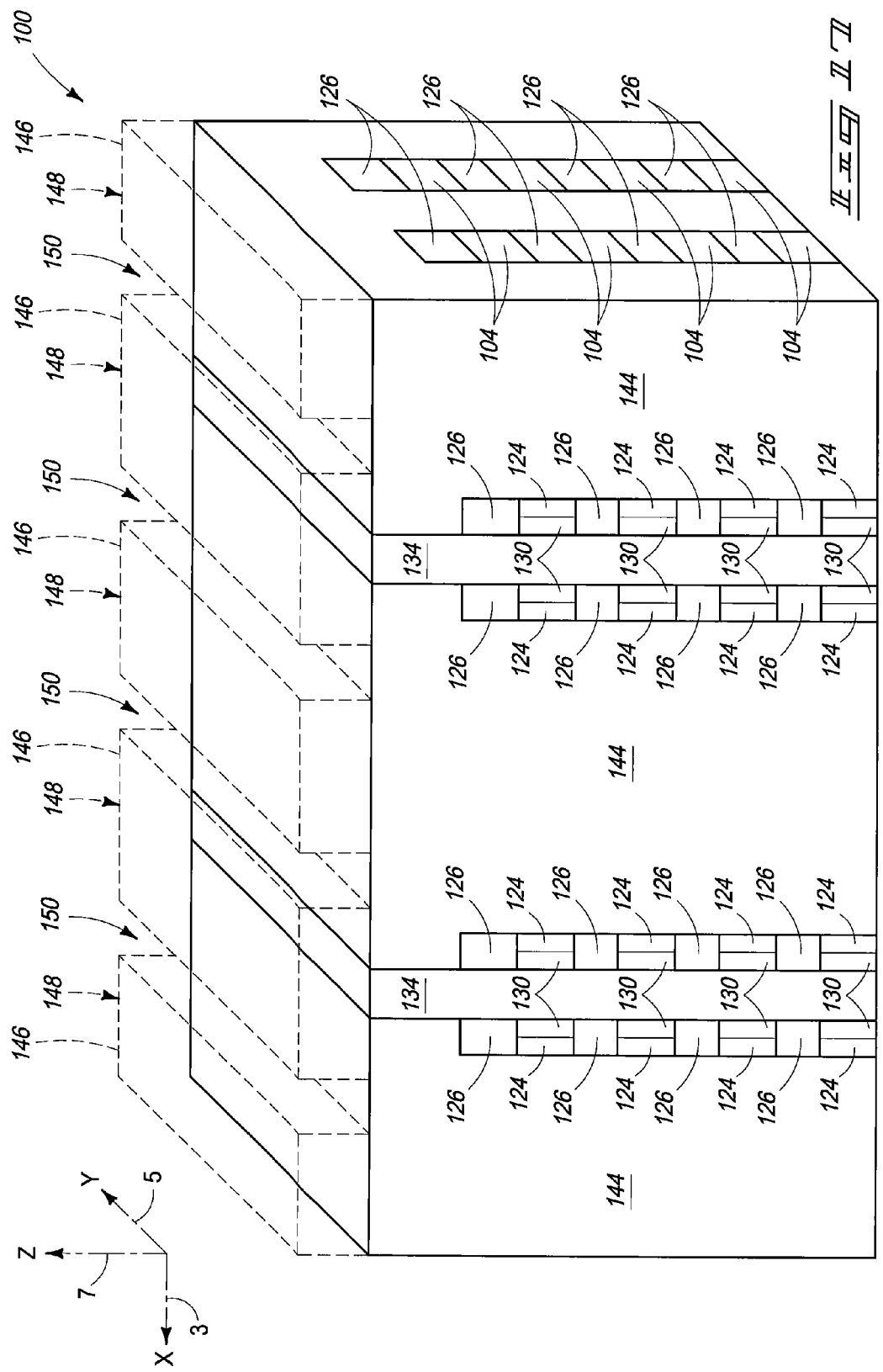
FIGS. 17-19 are diagrammatic three-dimensional views of the portion of FIG. 5 shown at sequential processing stages of an example embodiment method of forming a memory array, with the processing stage of FIG. 17 following that of FIG. 15.

Referring to FIG. 17, masking material 146 (shown in phantom view) is formed over the insulative material 144. The masking material is patterned into a plurality of features 148 which are spaced from one another by gaps 150. Masking material 146 may comprise any suitable composition; including, for example, a hard mask composition.

Figure 18:
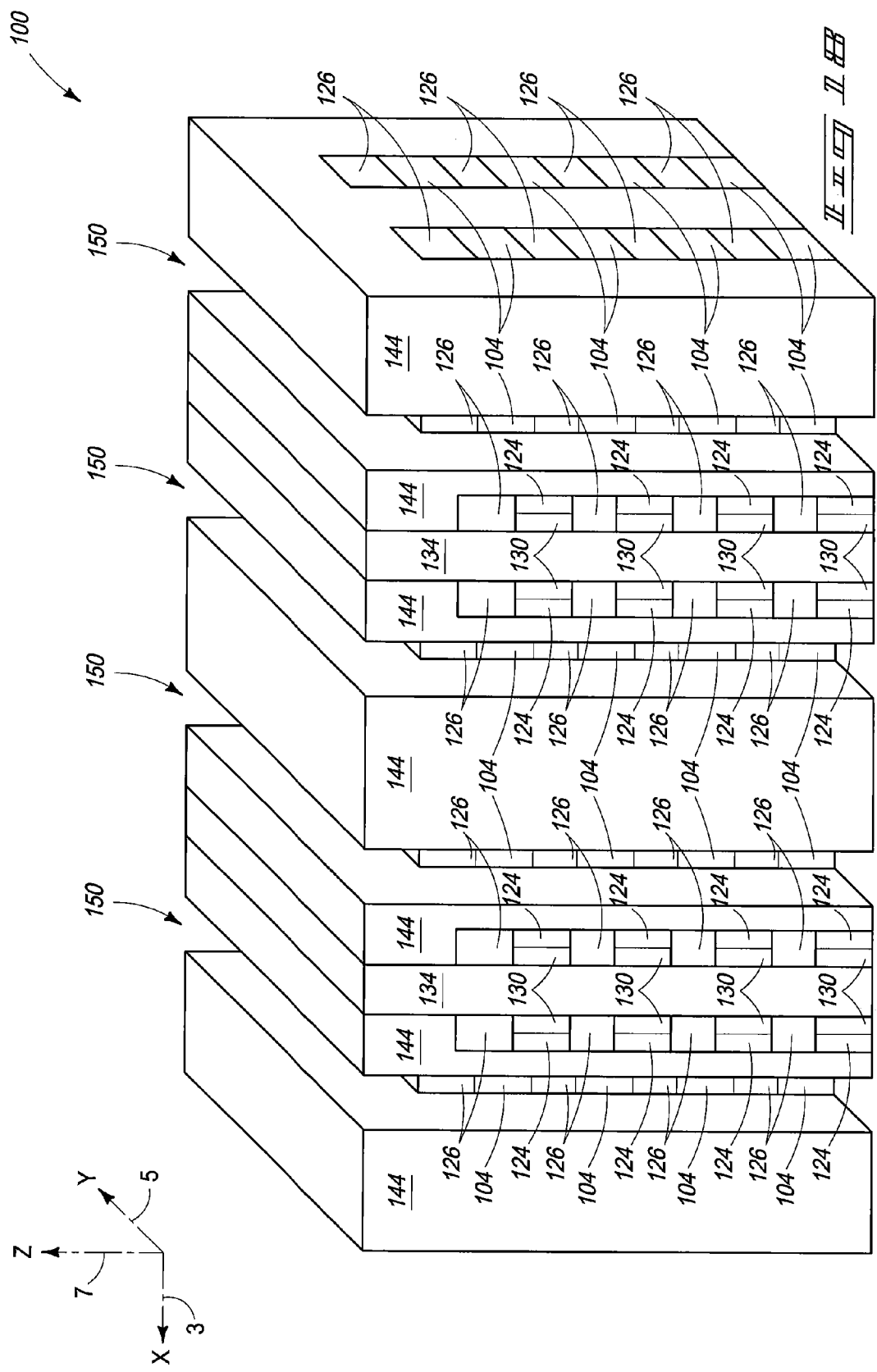

Referring to FIG. 18, gaps 150 are extended through insulative material 144 with one or more suitable etches, and then masking material 146 (FIG. 17) is removed.

Figure 19:
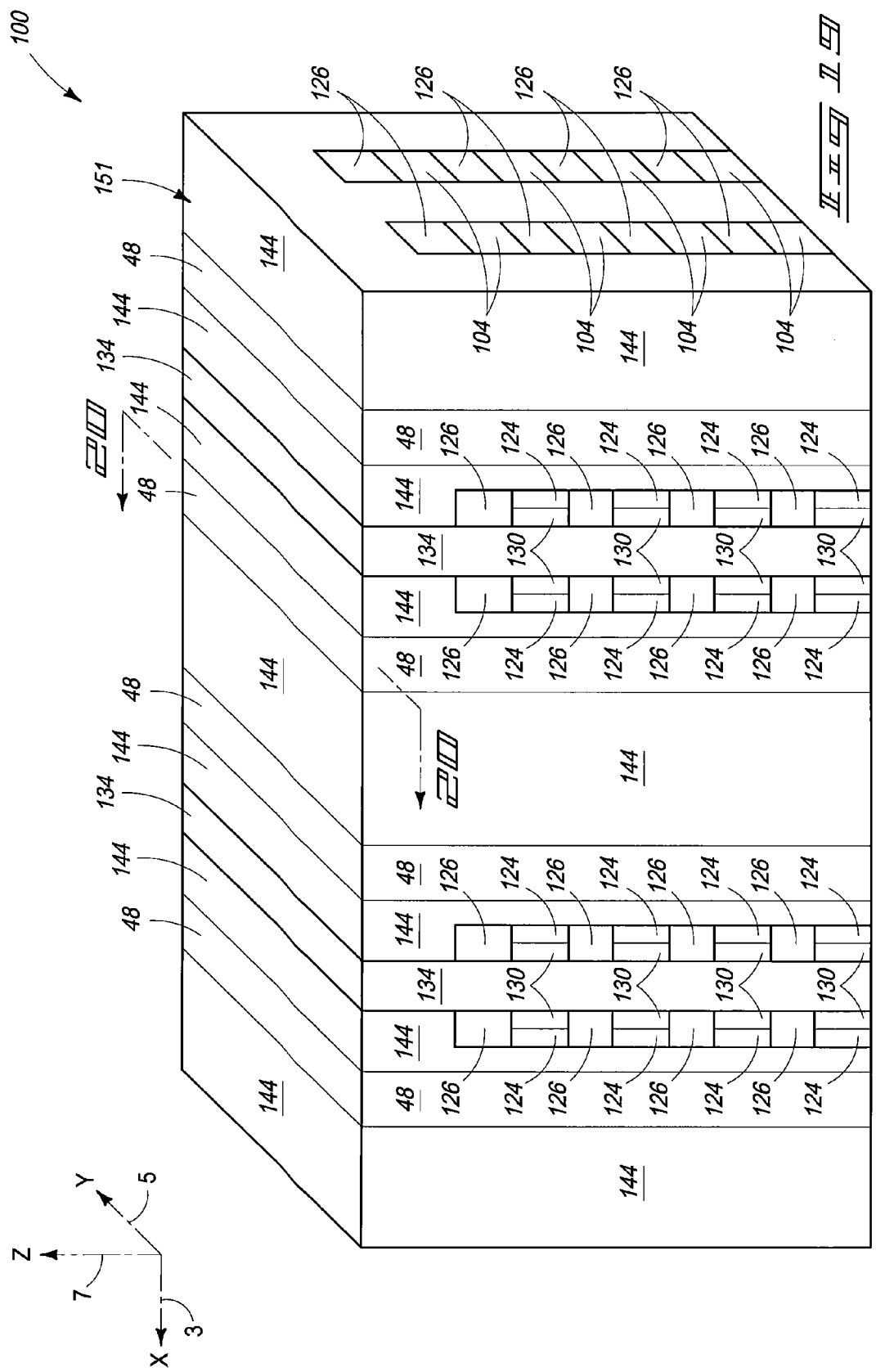
Figure 20:
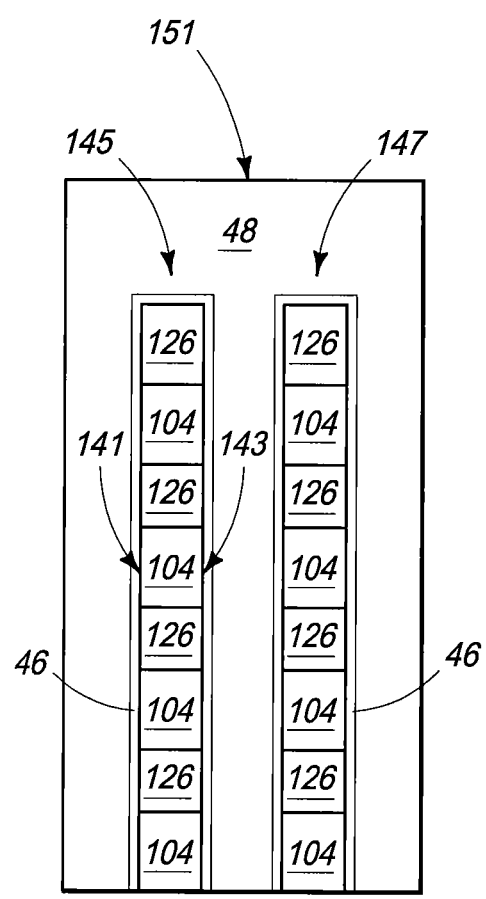
FIG. 20 is a diagrammatic cross-sectional side view along the line 20-20 of FIG. 19.

Referring to FIGS. 19 and 20, gate dielectric 46 (FIG. 20) and gate material 48 are formed within gaps 150 (FIG. 18) and over the stacked materials 104/126. The gate material may then be subjected to planarization, for example CMP, to form the shown planarized surface 151 extending across materials 48, 134 and 144. The gate dielectric 46 and gate material 48 can be identical to the gate dielectric and gate material discussed above with reference to FIGS. 1 and 2. Although the gate dielectric is shown to be homogeneous, in other embodiments (not shown), the gate dielectric may comprise two or more different materials. Also, although only one gate material is shown, in other embodiments (now shown) multiple gate materials may be utilized.

FIG. 20 shows that the lines formed from the alternating materials 104 and 126 (such lines extend in and out of the page relative to the cross-sectional view of FIG. 20) create vertically-extending stacks (with a pair of such stacks being shown in FIG. 20, and being labeled as stacks 145 and 147). Each stack has a pair of opposing sidewalls (the opposing sidewalls of stack 145 are labeled 141 and 143). The gate dielectric 46 extends along and directly against the insulative material 126 and the semiconductor material 104 of such sidewalls; and the gate material 48 extends along the sidewalls, and is spaced from the sidewalls by the gate dielectric.

Figure 21:
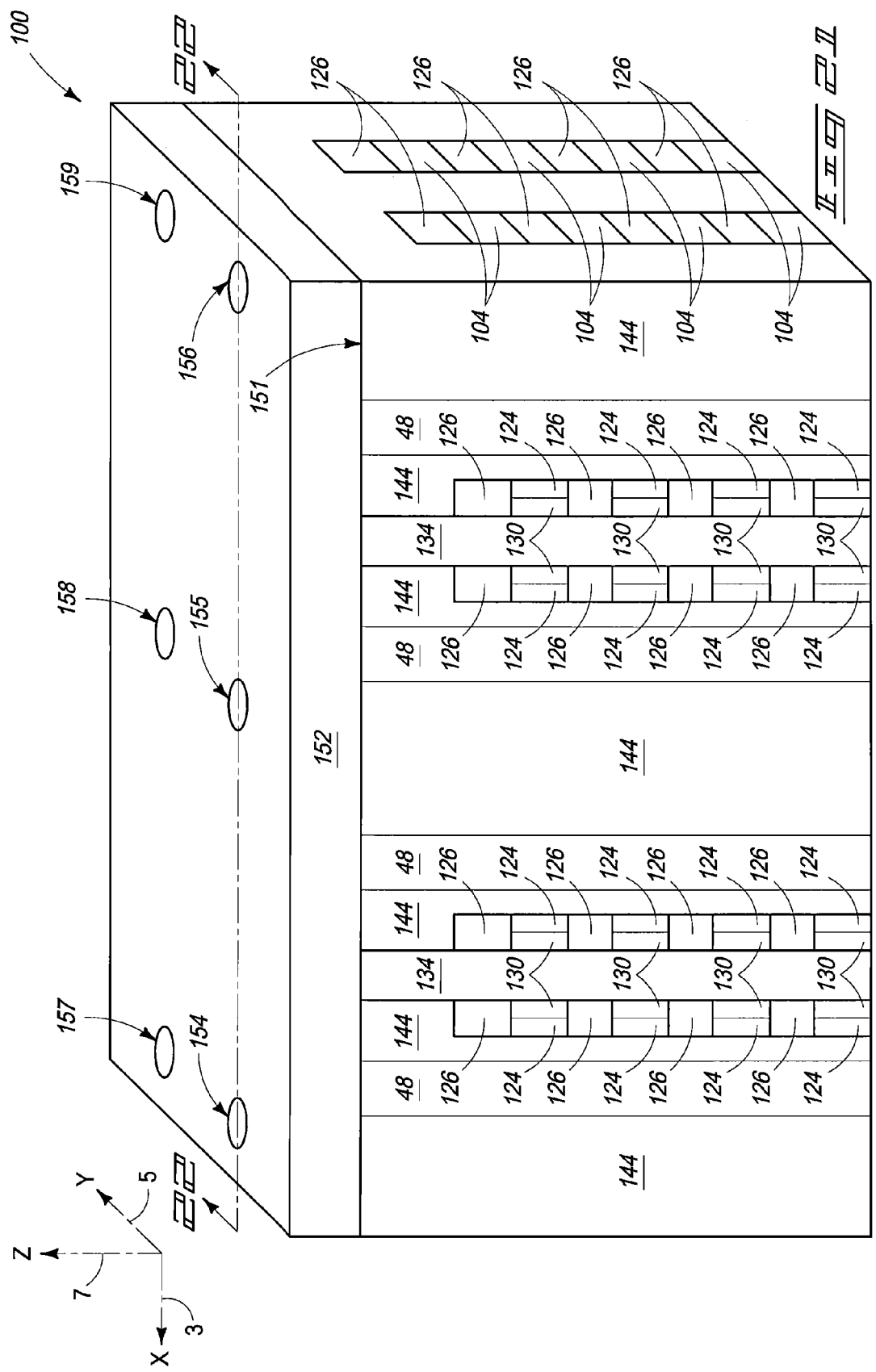
FIG. 21 is a diagrammatic three-dimensional view of the portion of FIG. 5 shown at a processing stage subsequent to that of FIG. 19.
Figure 22:
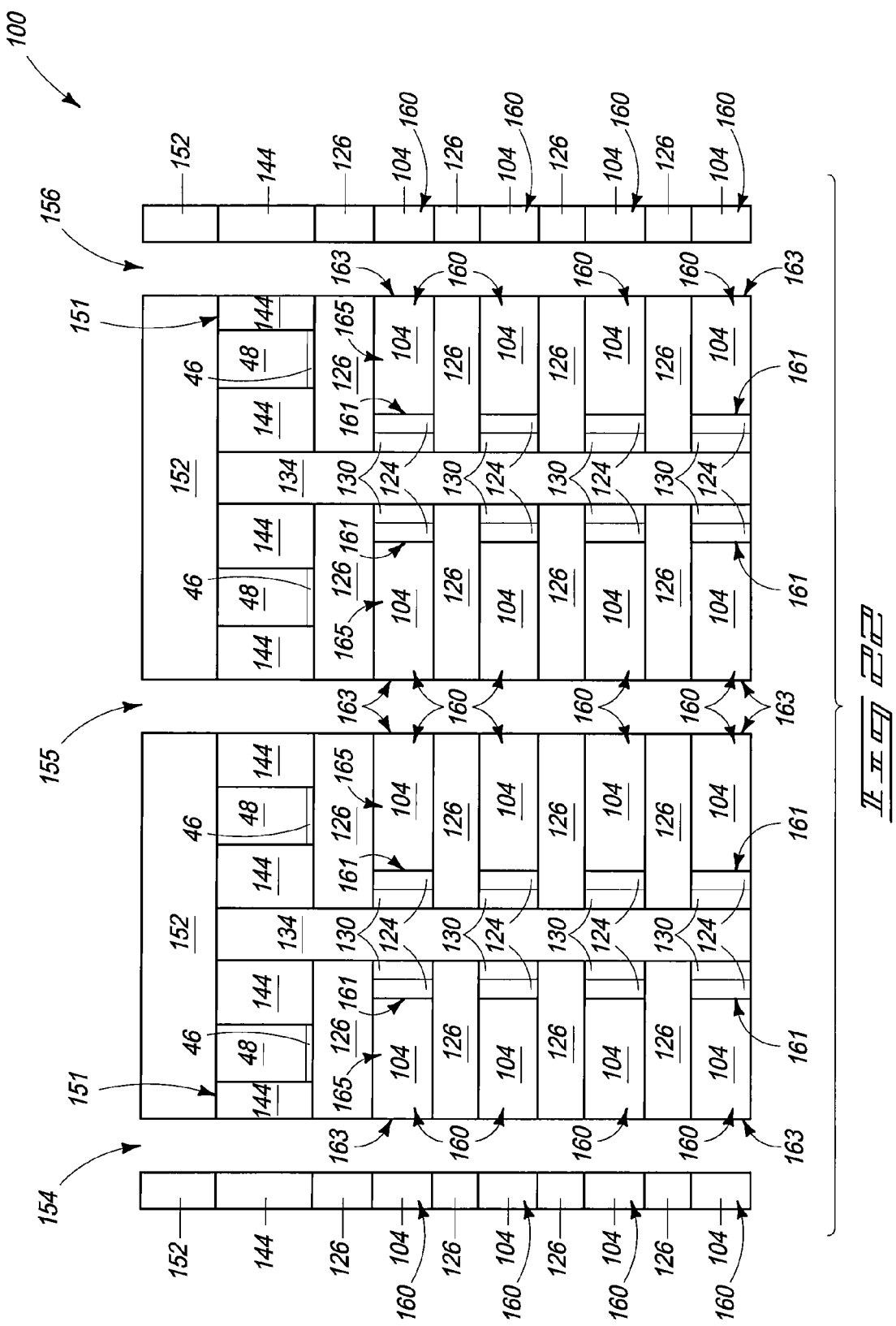
FIG. 22 is a diagrammatic cross-sectional side view along the line 22-22 of FIG. 21.

Referring to FIGS. 21 and 22, patterned masking material 152 is formed over planarized surface 151. The patterned masking material has openings 154-159 extending therethrough. The patterned masking material may comprise a hard mask composition, and may be patterned utilizing processing analogous to that discussed above with reference to FIG. 6 for patterning the material of mask 110. The patterned masking material is utilized during etching through materials 104, 126 and 144. Such etching extends openings 154-159 through materials 104, 126 and 144 as shown in FIG. 22.

Once that openings 154-159 penetrate through the various lines of semiconductor material 104, the lines are broken into segments; with each segment corresponding to a wire 160. The wires 160 are analogous to the wires 24-39 discussed above with reference to FIGS. 1 and 2. Each of the wires 160 has a first end joined to the tiers comprising silicide 130, and a second end in opposing relation to the first end. The second ends of the wires are along the openings 154-159. Some of the first ends of the wires 160 are labeled 161 in the cross-sectional view of FIG. 22, and some of the second ends of the wires 160 are labeled 163 in FIG. 22. The wires 160 also have intermediate regions between the first and second ends, with such intermediate regions extending through gate dielectric 46 and gate material 48; analogously to the description provided above with reference to FIGS. 1 and 2. Some of the intermediate regions are labeled 165 in FIG. 22.

Analogously to the wires 24-39 discussed above with reference to FIGS. 1 and 2, the wires 160 may have the intermediate regions 165 doped to be channel regions of transistor devices (for example, provided with a threshold voltage dopant), and may have the ends 161 and 163 heavily doped to be source/drain regions. In some embodiments, the doping of the intermediate regions may occur during the initial formation of the semiconductor material in the stack of FIG. 3, and the doping of ends 161 may occur with the heaving doping at the processing stage of FIG. 8. In such embodiments, the doping of ends 163 may occur at the processing stage of FIG. 22 by implanting dopant into openings 154-159 to dope the portions of the wires 160 adjacent such openings. Alternatively, the doping of the ends 163 of wires 160 may occur at other processing stages, such as, for example, by out-diffusion of dopant from structures that are subsequently formed adjacent to the ends 163.

Figure 23:
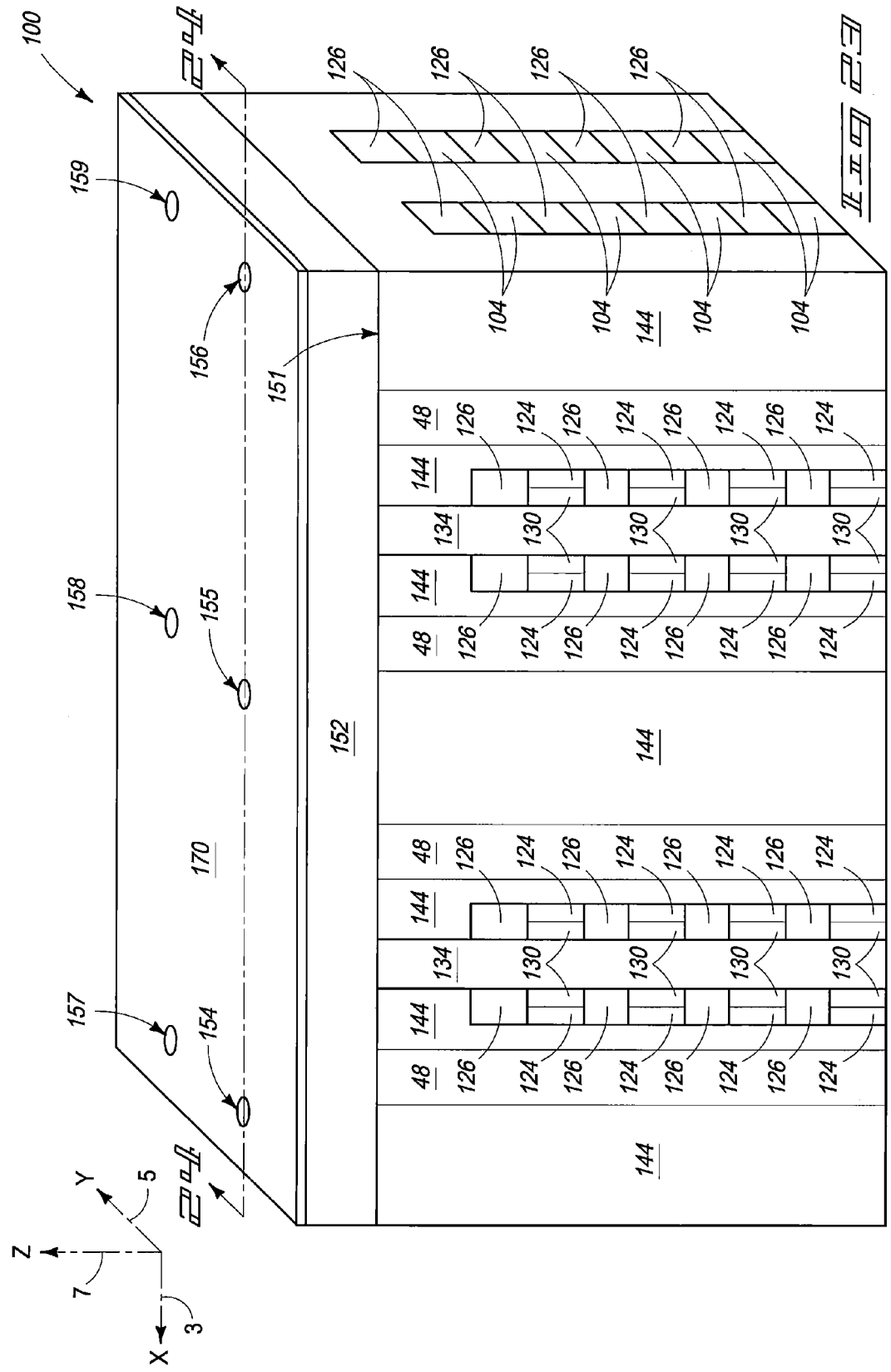
FIG. 23 is a diagrammatic three-dimensional view of the portion of FIG. 5 shown at a processing stage subsequent to that of FIG. 21.
Figure 24:
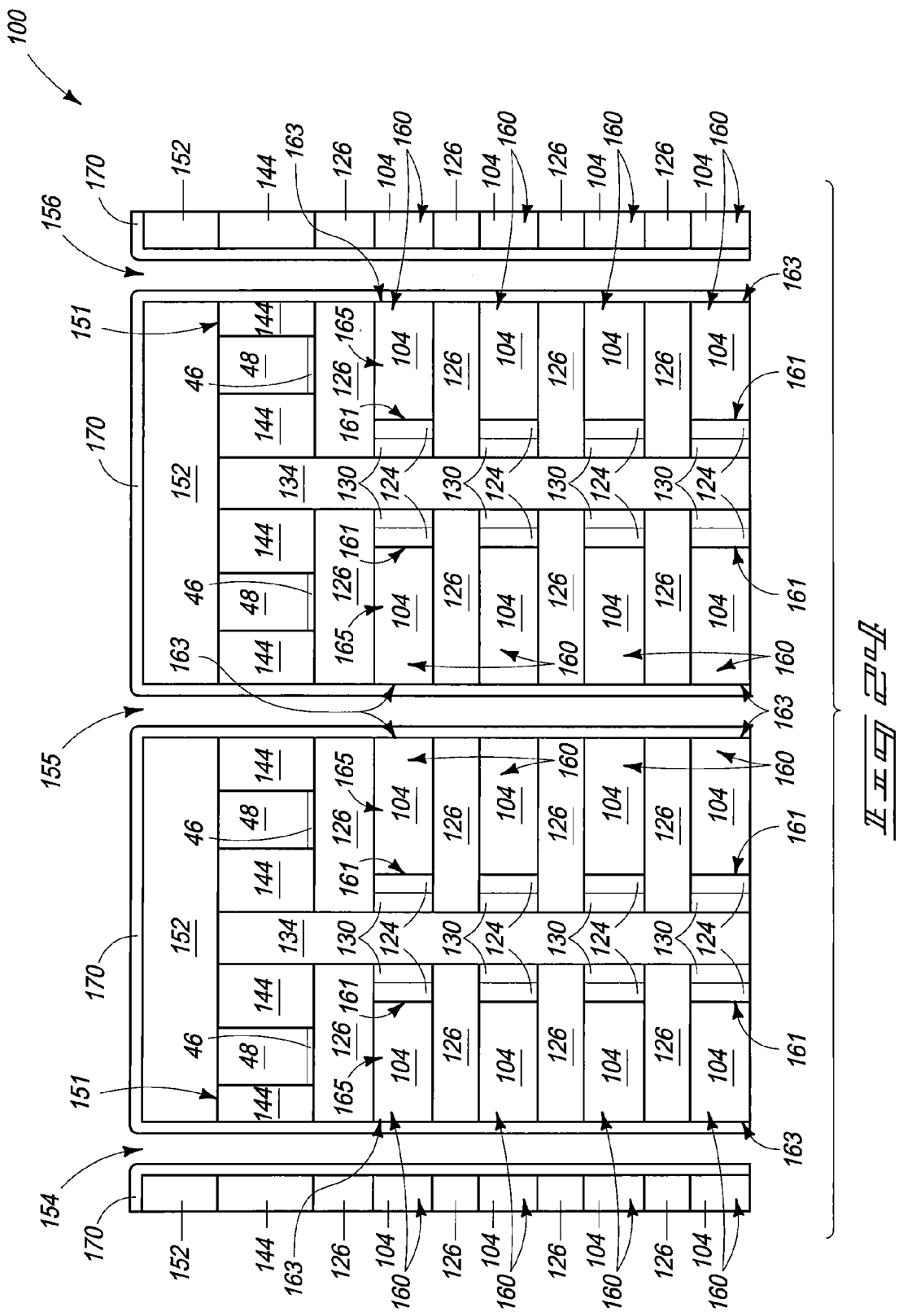
FIG. 24 is a diagrammatic cross-sectional side view along the line 24-24 of FIG. 23.

Referring to FIGS. 23 and 24, memory cell material 170 is formed within openings 154-159, and along the second ends 163 of wires 160. The memory cell material may be any composition suitable to form memory cell structures. For instance, if the memory cell structures are to be antifuses, the memory cell material 170 may be dielectric that is to be formed between a first electrode corresponding to an end 163 of a wire 160, and a second electrode that will be provided on an opposing side of the dielectric from the first electrode.

Although one memory cell material is shown, in some applications there may be multiple memory cell materials formed within the openings. For instance, the memory cell materials may correspond to a stack containing a thin layer of dielectric material sandwiched between a pair of conductive materials, so that the entire stack is provided as antifuse structures against the ends 163 of wires 160.

In some embodiments, the memory cell material 170 may comprise phase change material, and may be suitable for forming PCRAM type memory structures.

In some embodiments, memory cell materials may be provided to comprise a non-magnetic layer sandwiched between a pair of magnetic layers, and may be suitable for forming MRAM-type memory structures.

The memory cell material 170 forms a uniform lining within openings 154-159. Such may be accomplished with any suitable methodology, including, for example, one or more of ALD, CVD and physical vapor deposition (PVD).

Although the memory cell material 170 is shown forming a uniform lining along the sidewalls of openings 154-159, in other embodiments the memory cell material may be selectively formed only along the exposed ends 163 of the wires 160. Such selective placement of the memory cell material may utilize any suitable methodology, including, for example, selective ALD, electroless plating and/or electrolytic plating.

Figure 25:
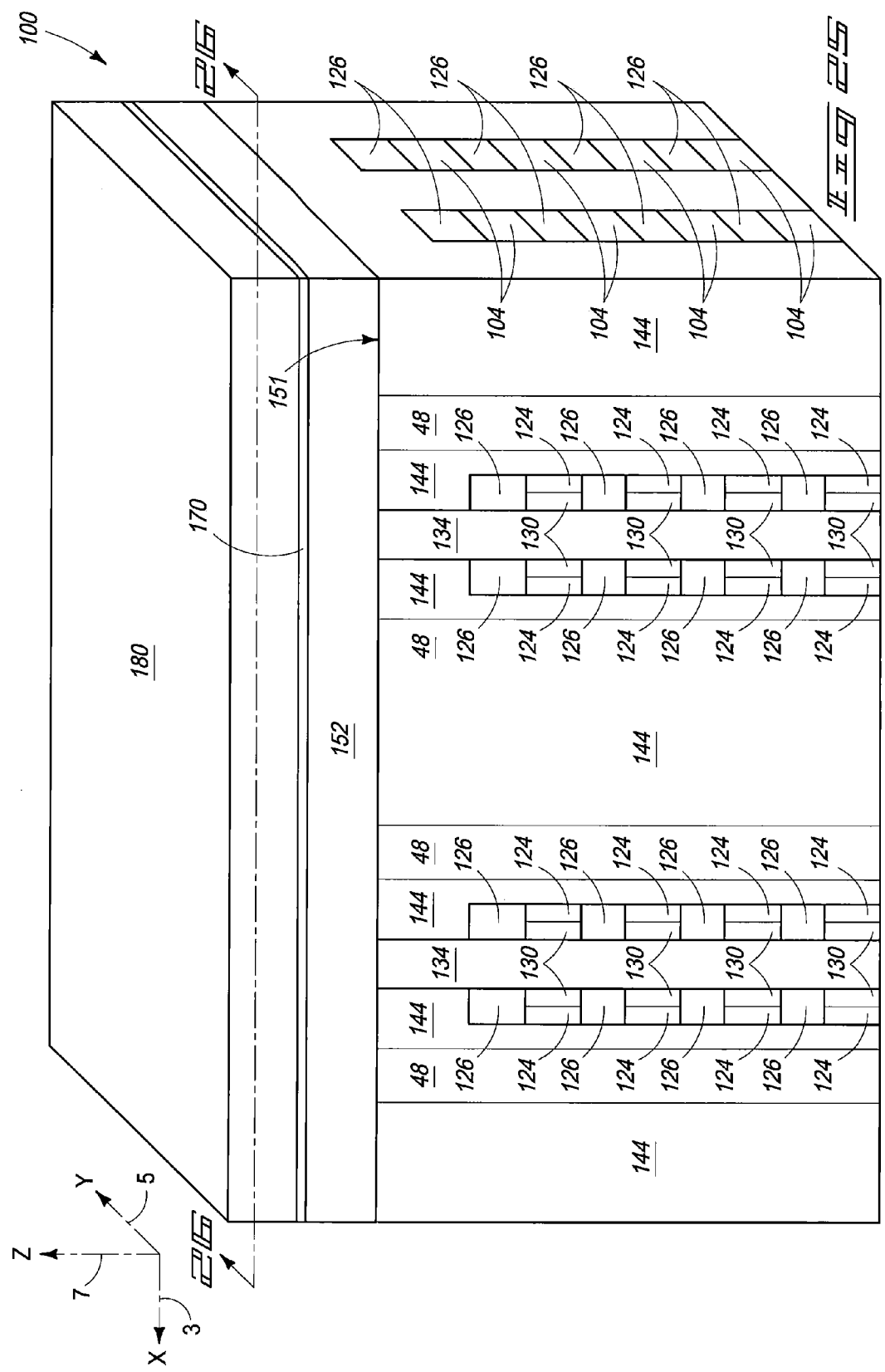
FIG. 25 is a diagrammatic three-dimensional view of the portion of FIG. 5 shown at a processing stage subsequent to that of FIG. 23.
Figure 26:
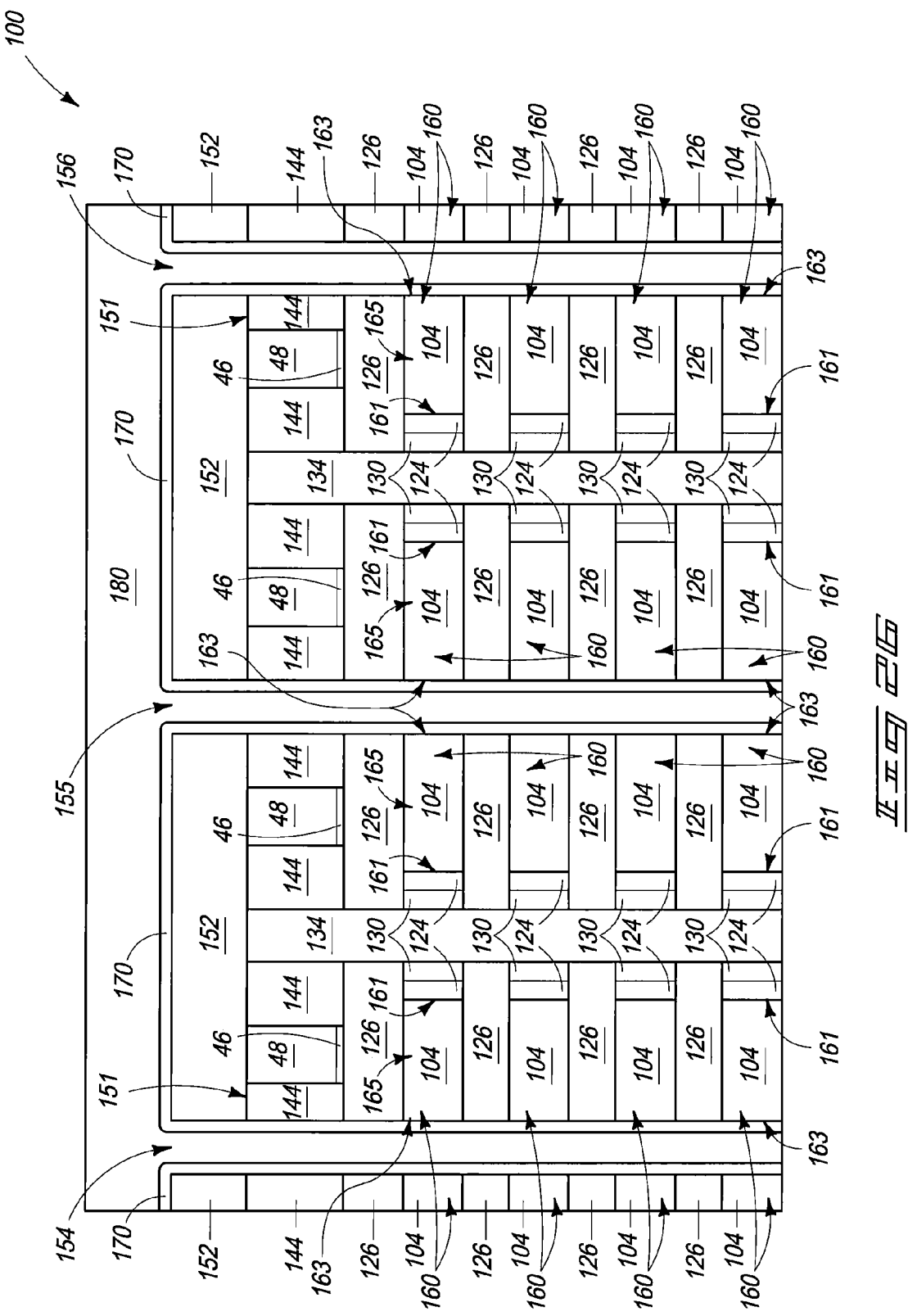
FIG. 26 is a diagrammatic cross-sectional side view along the line 26-26 of FIG. 25.

Referring to FIGS. 25 and 26, openings 154-159 (FIGS. 23 and 24) are filled with electrically conductive material 180. The electrically conductive material 180 may comprise any suitable composition, and in some embodiments may comprise one or more of various metals (for instance, titanium, tungsten, cobalt, nickel, etc.), metal-containing compositions (for instance, metal nitrides, metal silicides, etc.), and conductively-doped semiconductor materials (for instance, conductively-doped silicon, conductively-doped germanium, etc.). Although a single homogenous material 180 is shown filling the openings, in other embodiments (not shown) the openings may be filled with multiple materials. The one or more materials utilized to fill the openings may be formed by any suitable method, including, for example, one or more of CVD, ALD and PVD.

Figure 27:
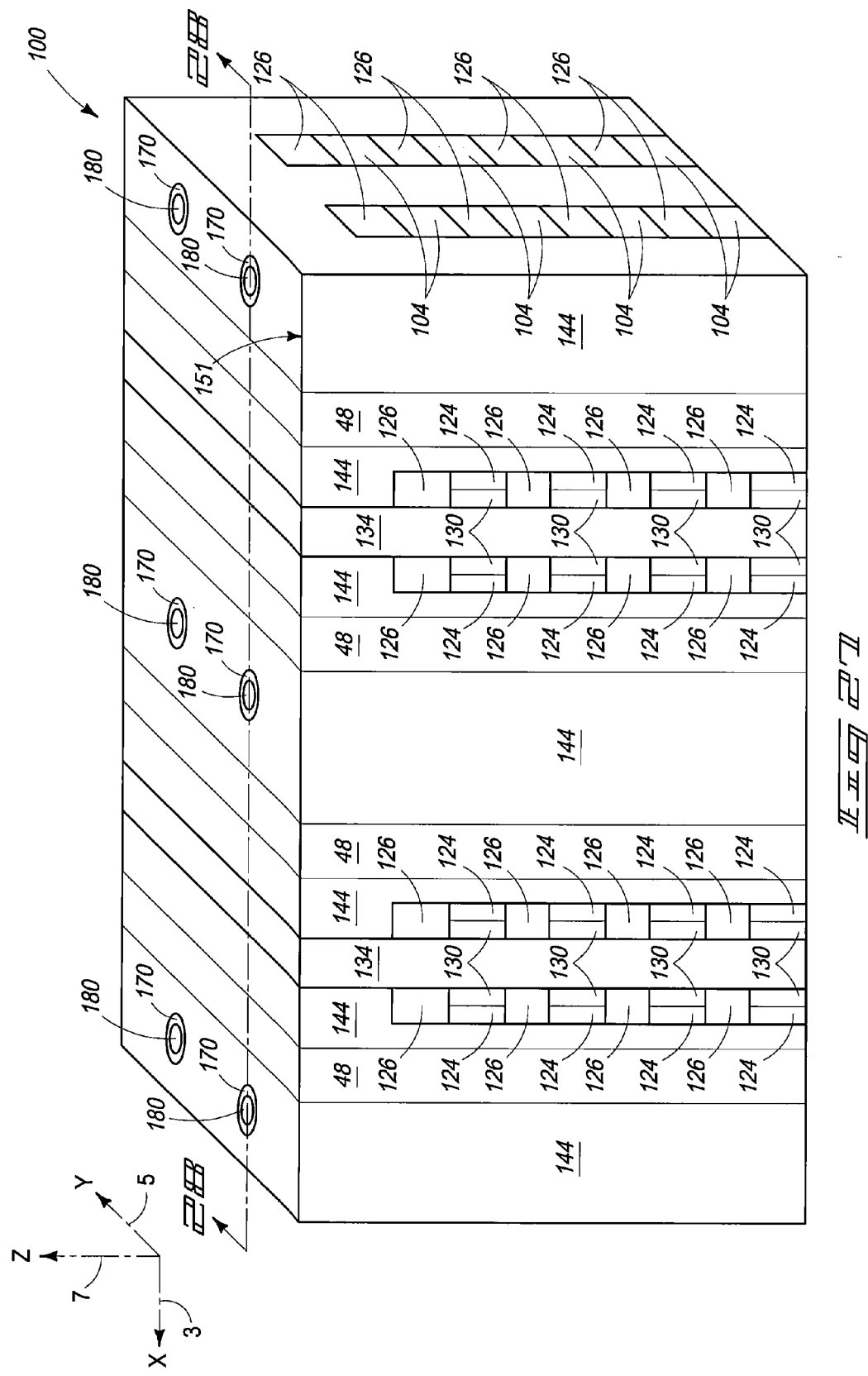
FIG. 27 is a diagrammatic three-dimensional view of the portion of FIG. 5 shown at a processing stage subsequent to that of FIG. 25.
Figure 28:
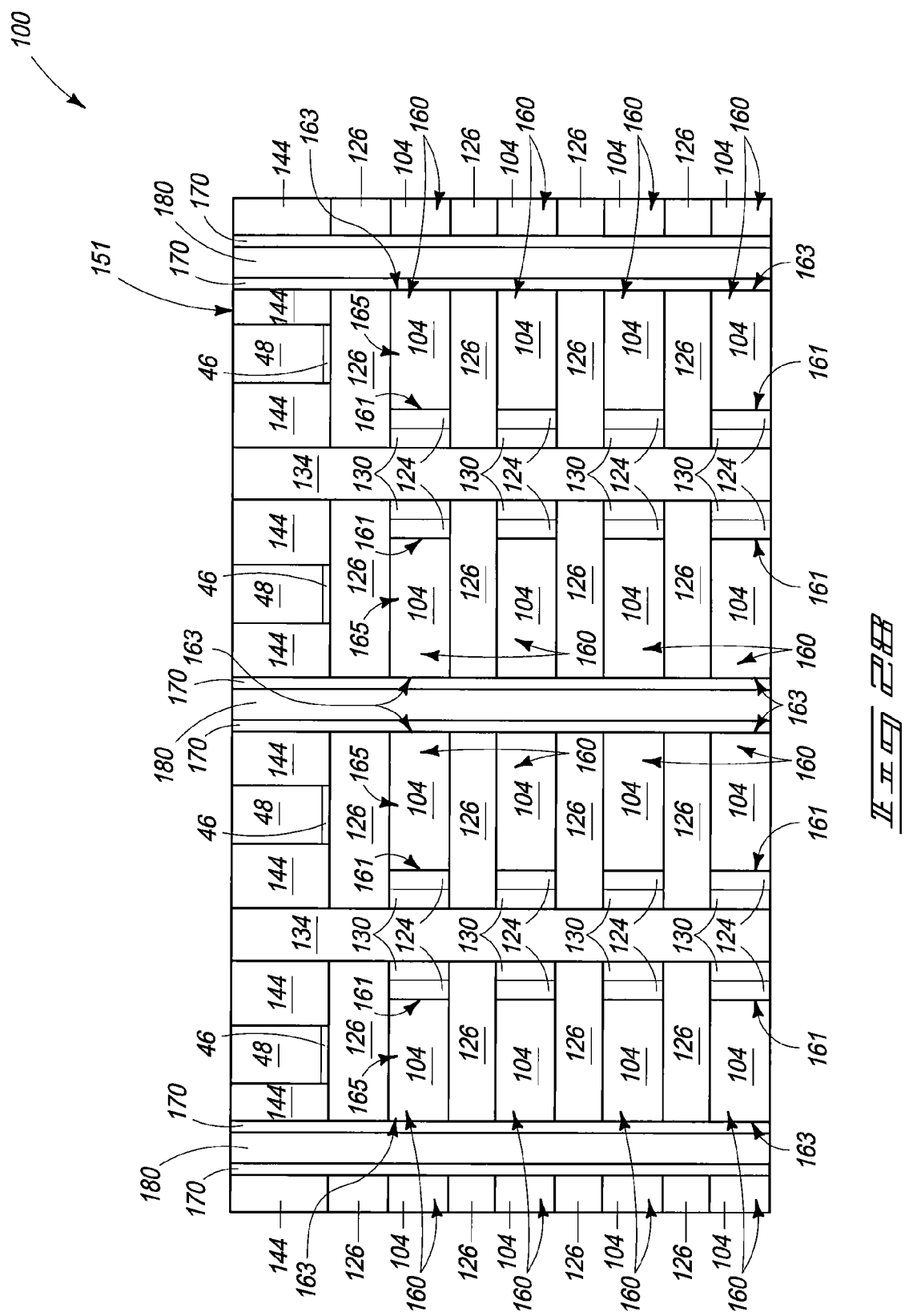
FIG. 28 is a diagrammatic cross-sectional side view along the line 28-28 of FIG. 27.

Referring to FIGS. 27 and 28, materials 152, 170 and 180 (FIGS. 25 and 26) are etched back to about the level of surface 151. Such etchback may be accomplished with CMP. The memory cell material 170 forms a plurality of tubes that extend vertically along the ends of wires 160; and the conductive material 180 forms electrically conductive cores within such tubes. The material 170 forms memory cell structures analogous to the memory cell structures 52 discussed above with reference to FIGS. 1 and 2, and the cores formed from conductive material 180 are vertical interconnects analogous to the bars 54, 56, 58 and 60 discussed above with reference to FIGS. 1 and 2.

Figure 29:
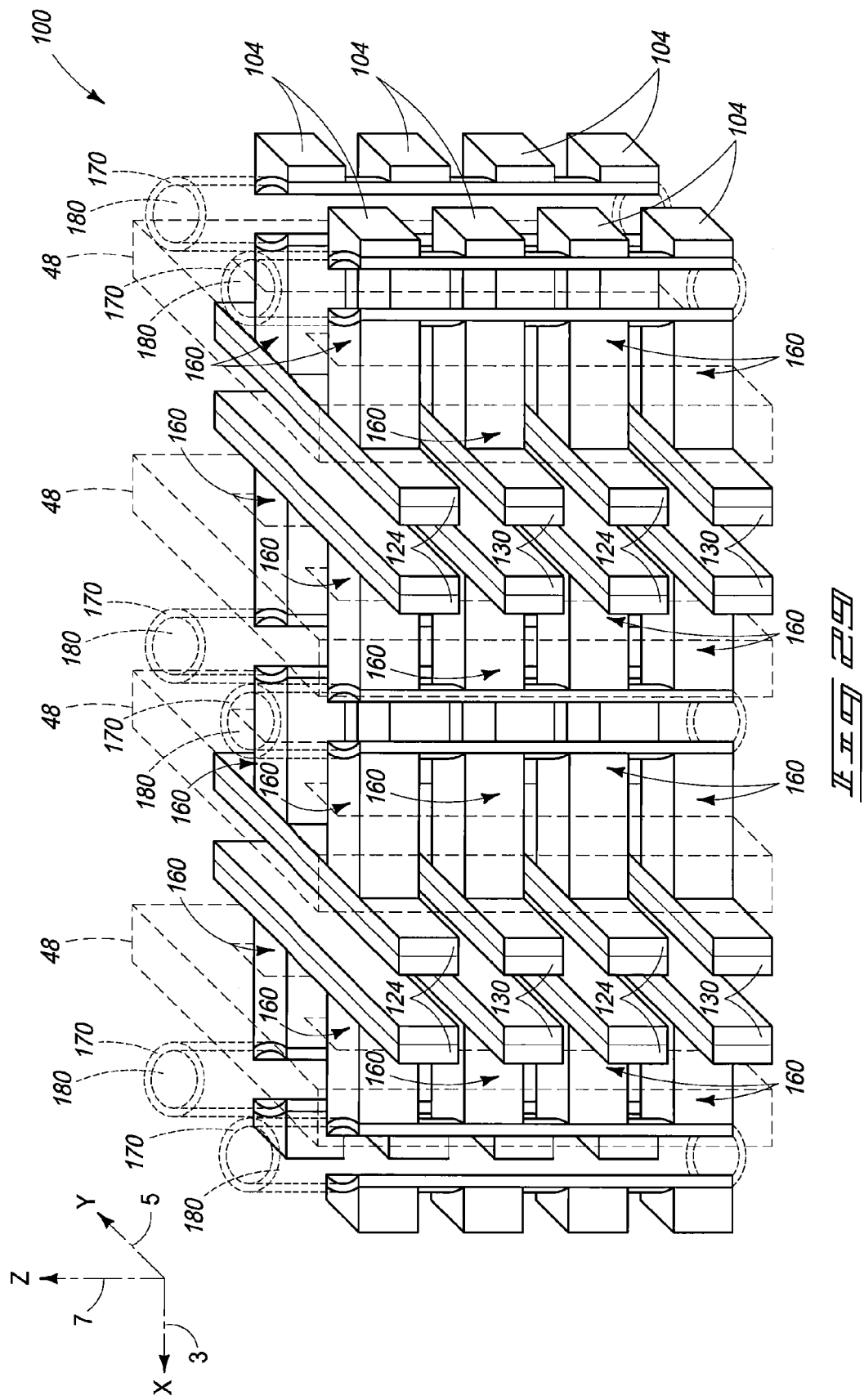
FIG. 29 is a diagrammatic three-dimensional view of various conductive structures of the integrated memory array formed at the processing stage of FIG. 27.

FIG. 29 shows the arrangement of the various primary components at the processing stage of FIGS. 27 and 28, in isolation from some of the insulative components of FIGS. 27 and 28, to assist the reader in visualizing the layout of various structures that are hidden from view in the diagram of FIG. 27. Some of the features illustrated in FIG. 29 are shown in phantom view so that other features may be seen behind them. The phantom view is not utilized to indicate importance, or lack thereof, of various features, or to indicate that certain features are optional. Only some of the various repeating structures of FIG. 29 are labeled, in order to simplify the drawing.

The embodiment of FIG. 29 is analogous to that of FIG. 1. The wires 160 of FIG. 29 are analogous to the wires 24-39 (FIG. 1), and, like the wires 24-39, form two-dimensional arrays containing rows and columns The conductive lines of material 130 form tiers analogous to the tiers 12, 14, 16 and 18 of FIG. 1, and, like the tiers 12, 14, 16 and 18, the tiers of FIG. 29 interconnect rows of wires. The conductive material 180 of FIG. 29 forms vertically-extending electrical interconnects, or cell strings, (specifically, cylindrical rods) analogous to the bars 54, 56, 58 and 60 of FIG. 1, and, like such bars, the vertically-extending electrical interconnects of FIG. 29 are along columns of the arrays of wires. The memory cell material 170 of FIG. 29 forms memory cell structures analogous to the structures 52 of FIG. 1. However, in the embodiment of FIG. 1 the memory cell structures 52 are formed of materials that are only at the ends of the wires, whereas in the embodiment of FIG. 29 the memory cell material 170 extends the full length of the vertical interconnects of material 180. The embodiment of FIG. 29 may be more cost-efficient to manufacture, and may be suitable in applications in which there will not be cross-talk through the memory cell material 170. In other applications, such as when there could be cross-talk between adjacent memory cells if the memory cell material were continuous between the adjacent memory cells, the embodiment of FIG. 1 may be more appropriate.

FIG. 29 shows that in some embodiments the cell strings corresponding to the vertically-extending electrical interconnects (i.e., the rods formed of material 180) may be shared by memory cells on opposing sides of the cell strings. Such may enable high levels of integration to be achieved.

Circuitry analogous to the circuitry 61-70 of FIG. 1 is not shown in FIG. 29, but such circuitry would be present. Various components of such circuitry may be in any desired location relative to the construction of FIG. 29; and accordingly may be below, above, or laterally adjacent the construction of FIG. 29.

Figure 30:
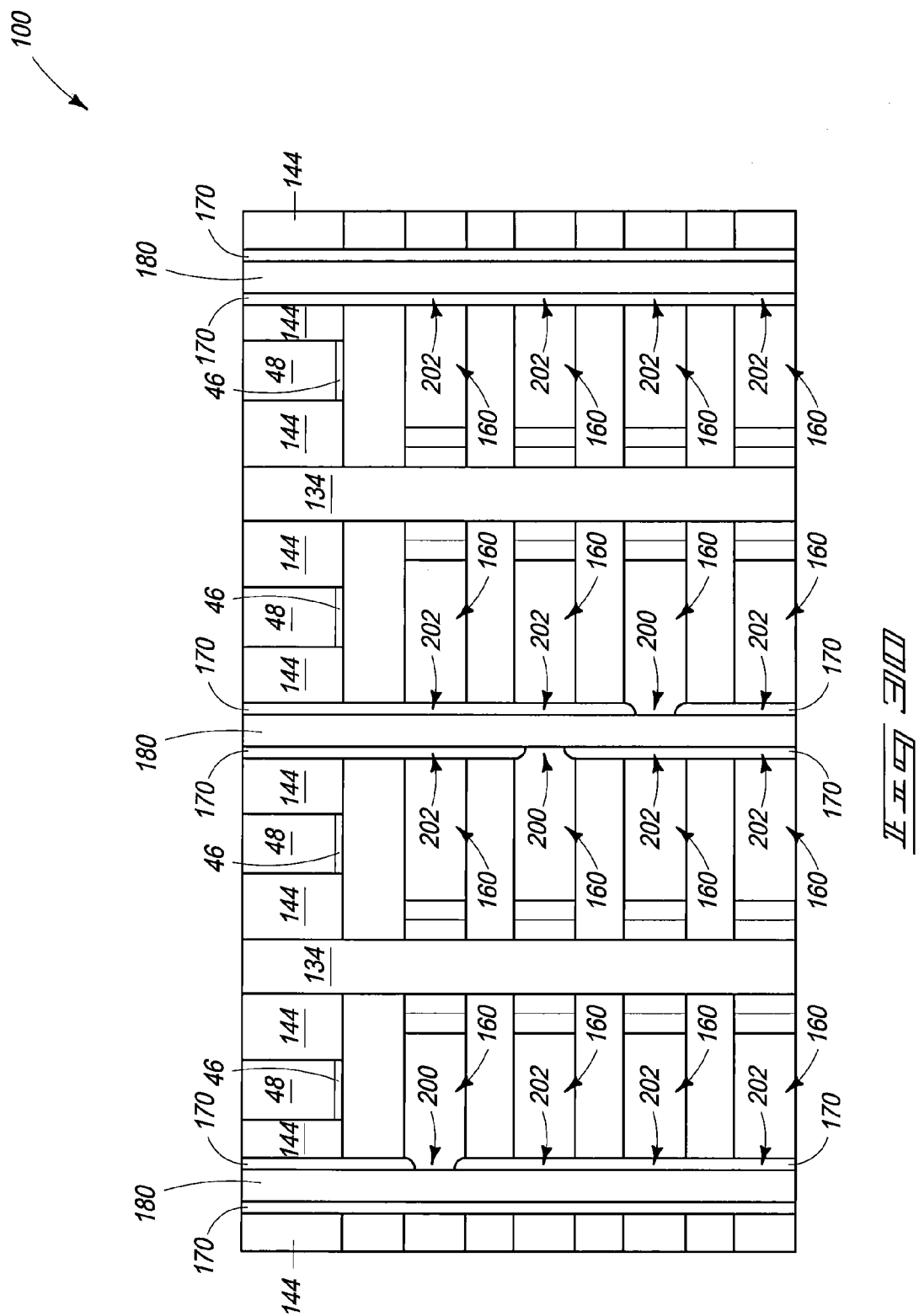
FIG. 30 is a diagrammatic cross-sectional side view of the construction of FIG. 28, shown at a processing stage subsequent to that of FIG. 28 in accordance with an example embodiment method for programming memory cells within a memory cell array.

As discussed previously, the one or more memory cell materials may be provided to form various types of memory cell structures suitable for storage of data. In some applications, the memory cell material 170 may correspond to a thin layer of dielectric material utilized to form antifuses between the wires 160 and the rods formed of material 180. Data may be stored by either blowing an antifuse (to break down the dielectric and form a conductive contact) or not blowing an antifuse. FIG. 30 shows the construction 100 of FIG. 28 in an application in which the memory cell material 170 consists of the thin dielectric material utilized for antifuses. The construction is shown after programming has been conducted to form some regions 200 of blown antifuses, while leaving other regions 202 where the antifuses are not blown. The blown antifuses may correspond to one type of data bit, while the not-blown antifuses correspond to a different type of data bit; and thus the arrangement of blown and not-blown antifuses may store information. Such information may be later accessed by using different combinations of current through various gates, tiers and vertical columns of construction 100 to uniquely address the various memory cells of the construction.

The embodiments discussed above may be utilized in electronic systems, such as, for example, computers, cars, airplanes, clocks, cellular phones, etc.

Figure 31:
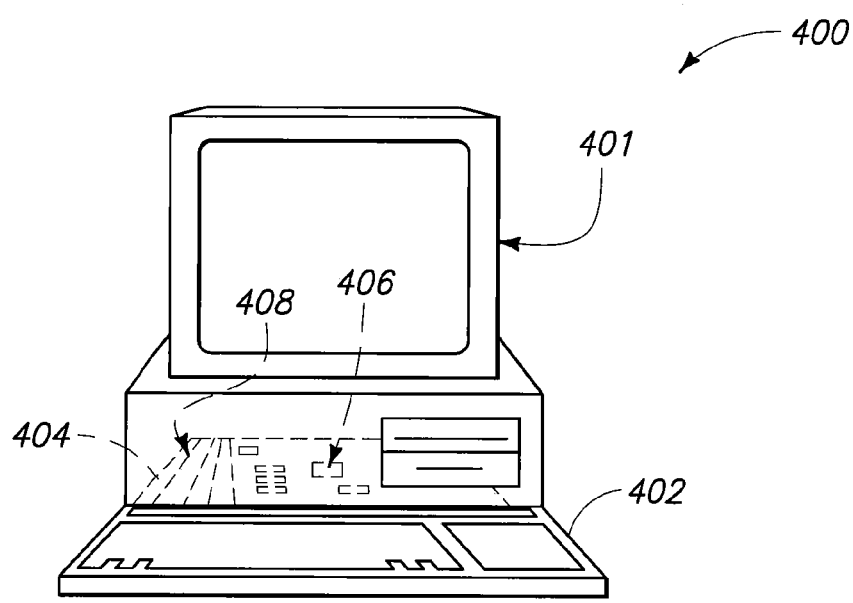
FIG. 31 is a diagrammatic view of a computer embodiment.
Figure 32:
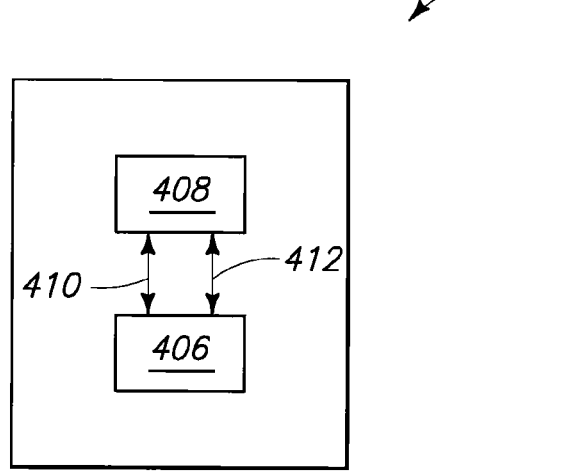
FIG. 32 is a block diagram showing particular features of the motherboard of the FIG. 31 computer embodiment.

FIG. 31 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 32. In such block diagram, the addressing circuitry is illustrated as 410 and the read circuitry is illustrated as 412.

Processor device 406 may correspond to a processor module, and associated memory utilized with the module may comprise various structures of the types described with reference to FIGS. 1-30.

Memory device 408 may correspond to a memory module, and may comprise various structures of the types described with reference to FIGS. 1-30.

Figure 33:
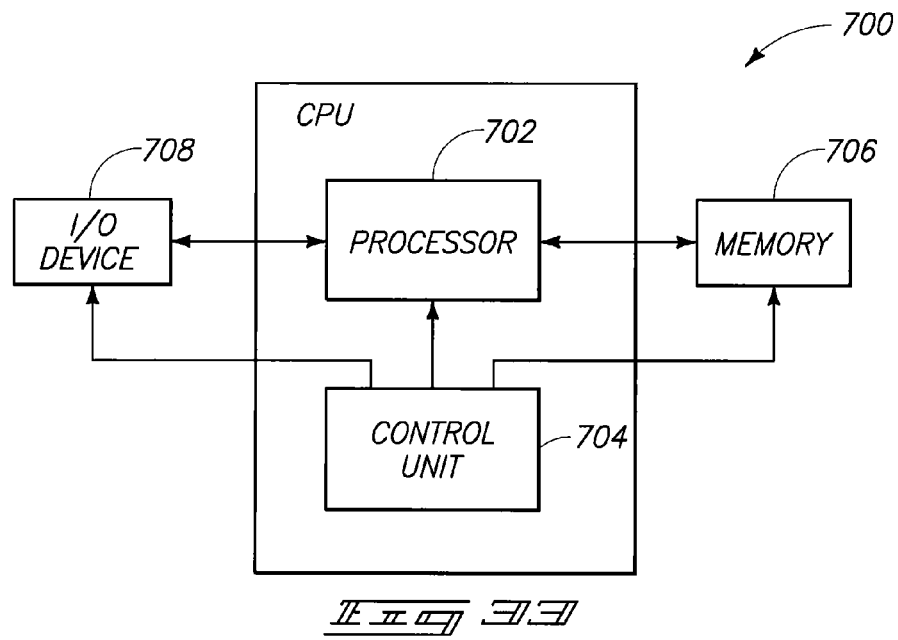
FIG. 33 is a high level block diagram of an electronic system embodiment.

FIG. 33 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include various structures of the types described with reference to FIGS. 1-30.

Figure 34:
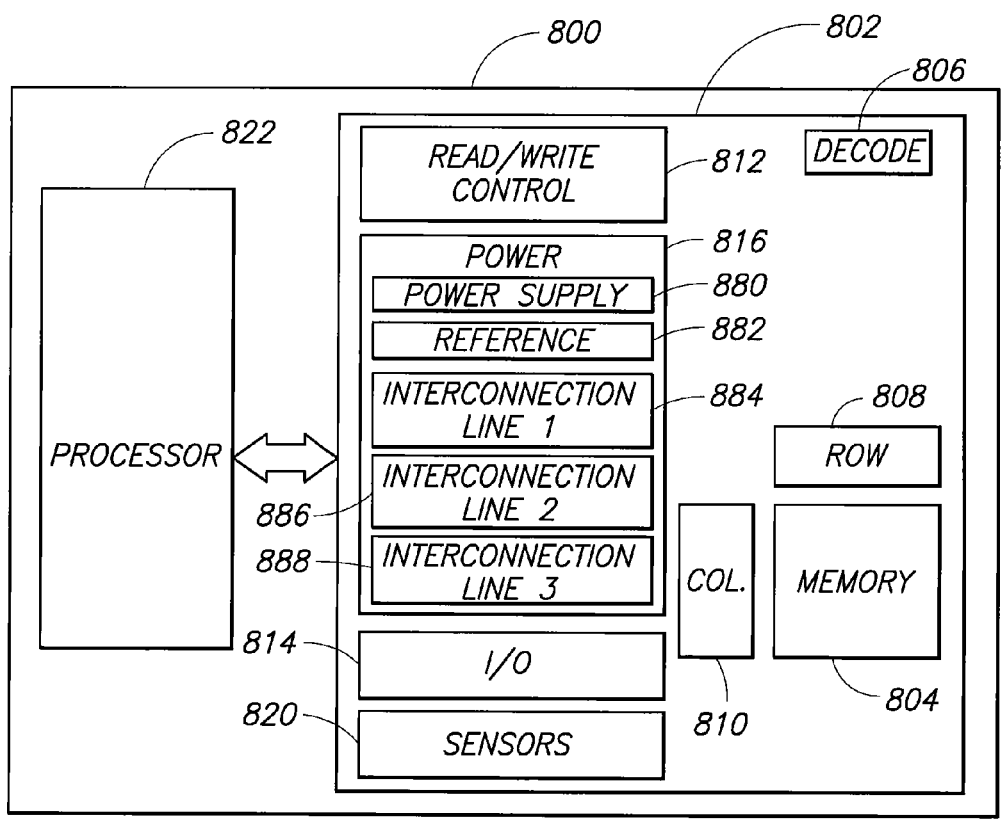
FIG. 34 is a simplified block diagram of a memory device embodiment.

FIG. 34 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first interconnection line (for instance, a wordline) with pulses, circuitry 886 for providing a second interconnection line (for instance, another wordline) with pulses, and circuitry 888 for providing a third interconnection line (for instance, a bitline) with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include various structures of the types described with reference to FIGS. 1-30.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory array, comprising:
   forming horizontally-extending electrically conductive tiers along and in electrical connection with sidewall edges of planar pieces of semiconductor material;
   patterning the planar pieces into an array of wires; the array comprising vertical columns and horizontal rows; individual wires having first ends joining to the electrically conductive tiers, having second ends in opposing relation to the first ends, and having intermediate regions between the first and second ends;

forming at least one gate material along the intermediate regions of the wires;

forming memory cell structures at the second ends of the wires; and forming a plurality of vertically-extending electrical interconnects connected to the wires through the memory cell structures.

2. The method of claim 1 wherein the forming of the electrically conductive tiers comprises:

doping semiconductor material of sidewall edges of the planar pieces; and forming metal silicide runners from the doped semiconductor material.

3. The method of claim 2 wherein the metal silicide runners comprise one or more of cobalt silicide, nickel silicide and titanium silicide.

4. The method of claim 1 wherein the forming of the electrically conductive tiers comprises:

recessing semiconductor material of sidewall edges of the planar pieces; and forming electrically conductive lines within the recesses.

5. A method of forming a memory array, comprising:

forming a stack of spaced-apart semiconductor material plates;

subdividing the plates into planar pieces;

forming electrically conductive tiers along and in electrical connection with sidewall edges of the planar pieces;

patterning the planar pieces into an array of wires; individual wires having first ends joining to the electrically conductive tiers, having second ends in opposing relation to the first ends, and having intermediate regions between the first and second ends;

forming at least one gate material along the intermediate regions of the wires;

forming memory cell structures at the second ends of the wires; and forming a plurality of vertically-extending electrical interconnects connected to the wires through the memory cell structures.

6. The method of claim 5 wherein insulative material sheets are provided between the plates; and wherein the insulative material of the sheets is patterned during the subdividing of the plates into the planar pieces, as well as during the patterning of the planar pieces into the array of wires.

7. The method of claim 5 wherein the forming of the stack comprises:

forming alternating layers of first and second semiconductor materials, where the first semiconductor material is selectively removable relative to the second semiconductor material; and selectively removing the first semiconductor material relative to the second semiconductor material.

8. The method of claim 7 wherein the one of the first and second semiconductor materials consists of silicon, and wherein the other of the first and second semiconductor materials consists of silicon/germanium.

9. The method of claim 7 wherein the one of the first and second semiconductor materials is n-type doped, and wherein the other of the first and second semiconductor materials is p-type doped.

10. The method of claim 9 wherein layers of electrically insulative material are provided between the alternating layers of first and second semiconductor materials.

11. The method of claim 10 wherein the layers of electrically insulative material consist of silicon dioxide.

12. A method of forming a memory array, comprising:

forming a stack over a monocrystalline silicon-containing substrate, the stack comprising vertically-spaced semiconductor material plates;

etching through the plates to subdivide the plates into planar pieces;

forming horizontally-extending electrically conductive tiers along and in electrical connection with sidewall edges of the planar pieces;

patterning the planar pieces into an array of wires; the array comprising vertical columns and horizontal rows; the electrically conductive tiers interconnecting wires of individual rows of the array; individual wires having first ends joining to the electrically conductive tiers, having second ends in opposing relation to the first ends, and having intermediate regions between the first and second ends;

forming at least one gate material along the intermediate regions of the wires;

forming memory cell structures at the second ends of the wires; and forming a plurality of vertically-extending electrical interconnects connected to the wires through the memory cell structures; individual vertically-extending electrical interconnects being along individual columns of the array.

* * * * *